US006828914B2

(12) United States Patent
Zur et al.

(10) Patent No.: US 6,828,914 B2
(45) Date of Patent: Dec. 7, 2004

(54) IN-USE UNAMBIGUOUSLY DETERMINING THE NEAR-END-OF-LIFE STATE OF A COMBUSTION ENGINE BATTERY

(75) Inventors: Amos Zur, Petach Tikva (IL); Offer Lapidot, Yavne (IL)

(73) Assignee: Battery Alert Ltd., Yavne (IL)

( * ) Notice: Subject to any disclaimer, the term of this patent is extended or adjusted under 35 U.S.C. 154(b) by 32 days.

(21) Appl. No.: 10/387,400

(22) Filed: Mar. 14, 2003

(65) Prior Publication Data

US 2004/0124990 A1 Jul. 1, 2004

Related U.S. Application Data

(63) Continuation-in-part of application No. PCT/US01/25596, filed on Aug. 16, 2001.

(51) Int. Cl.[7] .............................................. G08B 21/00
(52) U.S. Cl. .............................. 340/636.1; 340/636.15; 340/636.19; 340/661; 340/438; 340/455; 324/433
(58) Field of Search ........................ 340/636.1, 636.19, 340/636.15, 660, 661, 438, 455, 636.2; 324/433, 428, 384

(56) References Cited

U.S. PATENT DOCUMENTS

| | | | |
|---|---|---|---|
| 3,997,888 A | 12/1976 | Kremer | ...................... 340/249 |
| 4,025,916 A | * 5/1977 | Arnold et al. | ......... 340/636.16 |
| 4,665,370 A | 5/1987 | Holland | ...................... 324/429 |
| 4,731,601 A | 3/1988 | Nowakowski et al. | .... 340/52 R |
| 4,937,528 A | 6/1990 | Palaisamy | .................... 324/430 |
| 4,943,777 A | 7/1990 | Nakamura | .................. 324/433 |
| 4,968,942 A | 11/1990 | Palanisamy | ................. 324/430 |
| 5,130,659 A | * 7/1992 | Sloan | ........................ 324/435 |
| 5,281,919 A | 1/1994 | Palanisamy | ................. 324/427 |
| 5,339,017 A | 8/1994 | Yang | ........................... 320/13 |
| 5,818,333 A | 10/1998 | Yaffe et al. | ................. 340/455 |
| 6,091,325 A | 7/2000 | Zur et al. | .................... 340/455 |
| 6,424,157 B1 | * 7/2002 | Gollomp et al. | ............ 324/430 |
| 6,633,165 B2 | * 10/2003 | Bertness | ..................... 324/426 |

* cited by examiner

Primary Examiner—Daniel J. Wu
Assistant Examiner—Sihong Huang
(74) Attorney, Agent, or Firm—G.E. Ehrlich (1995) Ltd.

(57) ABSTRACT

Determining near-end-of-life (NEOL) state of a combustion engine battery, comprising: first and second multi-functional modules operatively connected to a logic function linking group, each operating with different low cranking strength criteria based on using different reference voltages, and each counting a different number of occurrences of low cranking strength exhibited by the battery, for a plurality of engine startings; a third multi-functional module, additionally operatively connected to the logic function linking group, monitoring extent the battery was recharged by the charging system of the combustion engine during previous operation of the combustion engine, during each engine starting; and logic function linking group, performing logic operations and making decisions using simultaneously received output values of first, second, and third, multi-functional modules, for unambiguously determining a single logically correct specific case associated with the combustion engine battery in, or not in, the near-end-of-life state.

36 Claims, 4 Drawing Sheets

IN-USE UNAMBIGUOUSLY DETERMINING THE NEAR-END-OF-LIFE STATE OF A COMBUSTION ENGINE BATTERY

RELATED APPLICATIONS

This is a continuation-in-part of PCT International Patent Application No. US01/25596, filed Aug. 16, 2001, entitled: "Method And Device For In-use Detecting Low Cranking Strength Of A Combustion Engine Battery During Engine Starting", claiming priority from recently allowed U.S. patent application Ser. No. 09/685,004, filed Oct. 6, 2000, of same title; both specifications of which are incorporated herein by reference.

FIELD AND BACKGROUND OF THE INVENTION

The present invention relates to automatically monitoring and determining the electrical condition of a combustion engine battery, and more particularly, to a method and device for in-use unambiguously determining and indicating the near-end-of-life (NEOL) state of a combustion engine battery. The present invention features means for in-use unambiguously distinguishing, and indicating, among different causes of the development or exhibition of low cranking strength of a combustion engine battery, with respect to the distinct differences between a bad state of health (SOH) and a bad state of charge (SOC) of the combustion engine battery.

Basic principles and details describing operation of a battery, a combustion engine, and the operative relationship of a battery as part of a combustion engine, needed for properly describing and understanding the present invention are provided herein. Complete theoretical descriptions, details, explanations, examples, and applications, of batteries, combustion engines, and the operative relationship of a battery as part of a combustion engine, are readily available in standard references, including patent literature, in the fields of electronics, mechanics, automotive technology, automotive mechanics, automotive electronics, battery technology, and combustion engine technology.

The present invention is directed to in-use monitoring (detecting, measuring, and analyzing) and determining the electrical condition of a battery of a 'combustion engine', being an engine powered by the burning or combusting of a fuel and includes a starting system or mechanism functioning for cranking a crankshaft for starting the combustion engine, and a charging system or mechanism which automatically recharges the battery of the combustion engine following starting of the combustion engine.

A combustion engine may be part of a vehicle, where a vehicle may be any mobile device powered by the combustion engine for carrying or transporting persons or objects of any kind, for example, an automobile, truck, farm vehicle such as a tractor or cotton combine, train, airplane, or boat. A combustion engine may also be part of a stand alone device, such as an electrical generator, a cement mixer, or a heavy duty power machine.

A battery is a principle component of the overall electrical system of any vehicle or device operable by a combustion engine, since so much depends upon its proper and reliable function. The important function of a battery in a combustion engine is most needed and appreciated at the time of starting the combustion engine. The starting operation of a combustion engine involves activation of a starter system or mechanism. A starter system or mechanism of a combustion engine typically features a multitude of electrical and mechanical devices, mechanisms, and components, including the battery as an initial source of electrical power, a starter motor for electro-mechanically meshing with and initiating turning or cranking of the crankshaft of the combustion engine motor, the combustion engine motor crankshaft, a coil for generating high voltage required for continuous operation of the combustion engine, and a myriad of related electrical and mechanical circuitry and operative connections among the various devices, mechanisms, and components, of the starter system or mechanism, as well as other devices, mechanisms, and components of the combustion engine. Accordingly, the starter system or mechanism of a combustion engine operates in relation to an electrically and mechanically varying load during engine starting, herein, also referred to as a 'starting load', where the overall starting load is due to operation of the above described combination of electrical and mechanical devices, mechanisms, and components required for starting the combustion engine.

Ordinarily, a combustion engine battery is characterized by a set of rated specifications and conditions of operation, such as 'cold cranking power or strength', typically indicated in terms of 'CCA' (cold cranking amperage), or 'cranking capacity', commonly indicated in terms of 'AH' (ampere hours), and 'warranty lifetime', typically indicated in terms of number of months, which are used for selecting a battery appropriate for a particular type of combustion engine and/or for performing a particular type of application.

Cranking strength of a combustion engine battery refers to the strength or ability of the battery to supply the necessary electrical energy, in the form of voltage and current, to the starter system or mechanism for effecting the initial cranking of the crankshaft of the combustion engine motor until the motor is started, and therefore, until the crankshaft continuously operates by energy supplied to the motor by a generator or alternator, without depending only upon the battery. Cranking of the combustion engine motor crankshaft during engine starting represents the most dominant or energy demanding component of the overall starting load.

During each use and operation of a combustion engine, immediately following starting of the combustion engine, at which time the battery is partly discharged due to the starting load, the charging system or mechanism of the combustion engine automatically recharges the battery, thereby replenishing the overall strength, in general, and the cranking strength, in particular, of the battery. At any time during the lifetime of a combustion engine battery, as a result of regular and/or irregular use and operation of the battery, if the cranking strength of the battery decreases, the strength or ability of the battery to 'properly' carry the overall starting load for energizing the starter system or mechanism likewise decreases. When the cranking strength of the battery decreases to below a particular threshold level, where the particular threshold level is determined according to specifications, characteristics, and operating behavior, of the starter system or mechanism of a particular type of combustion engine, whereby the battery exhibits low cranking strength, the battery is barely or no longer able to activate the starter system or mechanism for effecting the initial cranking of the crankshaft of the engine motor for starting the motor. Accordingly, low cranking strength of a combustion engine battery can be considered indicative that the strength or ability of the battery is no longer sufficient to regularly carry the overall starting load for starting the combustion engine motor, and therefore, no longer sufficient for regularly starting the combustion engine.

There are several different reasons why a combustion engine battery develops and eventually exhibits low cranking strength. These reasons are herein described in the context of the well known conditions or states, 'state of health' (SOH) and 'state of charge' (SOC), of a combustion engine battery.

The first reason a combustion engine battery develops or exhibits low cranking strength relates to a bad 'state of health' (SOH) of the battery. During normal lifetime of operation, use, and maintenance, of the combustion engine, in general, and of the combustion engine battery, in particular, as a consequence of the physical and electrochemical composition and behavior of a combustion engine battery, maximum attainable battery voltage gradually decreases with time. For example, during the normal lifetime of a lead acid type of (automotive) combustion engine battery, an electrolytic process, involving sulfating of the battery plates, continuously takes place inside the battery. Cumulative sulfating of the battery plates interferes with electrical functioning and operation of the battery, gradually decreasing the capacity of the battery for holding an appropriate charge needed for maintaining cranking strength at or above a desired threshold level.

A sufficient extent of sulfating of the battery plates leads to a deteriorating battery either developing or exhibiting low cranking strength, nearing the end of its functional life, and considered as having a 'bad' state of health (SOH). Herein, this condition of a combustion engine battery is referred to as the 'near-end-of-life' (NEOL) state of the combustion engine battery. The 'near-end-of-life' (NEOL) state of a combustion engine battery corresponds to the particular electrochemical state of the combustion engine battery whereby the combustion engine battery is near the end of it's life for providing sufficient strength or ability to supply the necessary electrical energy, in the form of voltage and current, to the starter system or mechanism for effecting the initial cranking of the crankshaft of the combustion engine motor until the motor is started, and therefore, until the crankshaft continuously operates by energy supplied to the motor by a generator or alternator, without depending only upon the battery.

By definition, full cranking strength of a combustion engine battery in the 'near-end-of-life' (NEOL) state cannot ordinarily be replenished or renewed for a sustained period of time by the automatic in-use recharging process performed by the charging system or mechanism of the combustion engine during normal use and operation of the combustion engine, or even by an externally located charging system or mechanism, such as an 'out-of-service' type of recharging procedure. The combustion engine battery, having a bad state of health (SOH) and in the 'near-end-of-life' (NEOL) state, is essentially unrechargeable and should be replaced by a new battery prior to the battery reaching the end of its life or becoming 'dead'.

Clearly, an important matter, potentially leading to an inconvenient or serious problem for an operator or user of a combustion engine, arises at the time the battery starts developing or exhibiting low cranking strength, whereby the battery is in the near-end-of-life (NEOL) state. The present invention is focused on in-use unambiguously determining this particular cause of low cranking strength of a combustion engine battery, relating to a bad state of health (SOH), by distinguishing it from -the particular causes, described immediately following, of low cranking strength relating to a bad state of charge (SOC) of the battery.

Two additional reasons a combustion engine battery develops or exhibits low cranking strength relate to a bad 'state of charge' (SOC) of the battery. Consistent with conventionally used terminology in the art, a combustion engine battery having a 'bad' state of charge (SOC) is only discharged, and is 'not' deteriorating or nearing the end of its functional life, and therefore, is 'not' considered as having a bad state of health (SOH) or in the 'near-end-of-life' (NEOL) state as described above. Accordingly, a combustion engine battery having a bad state of charge (SOC) is ordinarily considered to still have a 'good' state of health (SOH) and simply requires a recharge, followed by checking the combustion engine for identifying and eliminating the specific cause of the bad state of charge of the battery.

The first reason a combustion engine battery develops or exhibits low cranking strength, as a result of having a bad state of charge (SOC), relates to a malfunction or fault in the operation of the overall electrical system of a combustion engine. Since the battery is in electrical communication with multiple devices, mechanisms, and components, of the electrical system, a malfunction in one or more of such devices, mechanisms, or components, could cause abnormal and excessive drainage of battery voltage, and therefore decrease cranking strength of the battery. For example, a malfunctioning starter system or mechanism may involve an overly excessive load being placed upon the battery during starting conditions, thereby accelerating loss of battery cranking strength. Alternatively, a malfunctioning charging system or mechanism, featuring standard electrical system components such as an alternator or generator and related circuitry and wiring to the battery, may be abnormally recharging the battery during normal steady state operation and usage of the combustion engine. Alternatively, a fault in the circuit, wiring, or activation, of an anti-theft alarm device, may involve a relatively small, but continuous, parasitic load being placed upon the battery during engine non-operating conditions, thereby gradually accelerating loss of battery cranking strength, resulting in development or exhibition of low cranking strength as a result of a bad state of charge (SOC). Accordingly, in such scenarios, the combustion engine battery, having a bad state of charge (SOC), usually still has a good state of health (SOH) and simply requires a recharge, followed by checking the combustion engine for identifying and repairing the specific malfunction or fault in the operation of the overall electrical system of the combustion engine.

The second reason a combustion engine battery develops or exhibits low cranking strength, as a result of having a bad state of charge (SOC), relates to improper or careless actions of an operator or user of a vehicle or device at, or following, the time of turning off the combustion engine. For example, at the time of turning off the engine, where the operator fails to turn-off lights used for either driving the vehicle or operating the device, or, following engine turn-off, where the operator activates an accessory such as an audio system or lights for an excessive duration. Leaving lights on, especially the main high-intensity headlights, following engine turn-off, for an extended period of time such as more than a couple of hours, produces the highly undesirable effect of significant, or deep, battery discharge, leading to accelerated loss of battery cranking strength and ultimately termination of battery function as long as the battery remains in the deep discharged state or having a bad state of charge (SOC). Accordingly, in such scenarios, the combustion engine battery, developing or exhibiting low cranking strength caused by having a bad state of charge (SOC), usually still has a good state of health (SOH) and simply requires a recharge, followed by identifying and eliminating the specific improper or careless actions of the operator or user of the vehicle or device at, or following, the time of turning off the combustion engine.

Based upon the above discussion, a combustion engine battery having a bad state of health (SOH) exhibits low cranking strength in a manner similar to a combustion engine battery having a bad state of charge (SOC), and vice versa. However, and very important to an operator or user of a combustion engine, according to the particular type of cause, that is bad state of health (SOH) or bad state of charge (SOC), of the low cranking strength, significantly different actions are taken by the operator or user of the combustion engine whose battery is exhibiting low cranking strength. A combustion engine battery having a bad state of health (SOH) and in the 'near-end-of-life' (NEOL) state is essentially unrechargeable and should be replaced by a new battery prior to the battery reaching the end of its life or becoming dead. In strong contrast, a combustion engine battery having a bad state of charge (SOC) usually still has a good state of health (SOH) and simply requires a recharge. There is thus a need in the art for in-use unambiguously determining low cranking strength caused by the combustion engine battery having a bad state of health (SOH) or in the 'near-end-of-life' (NEOL) state, by distinguishing it from low cranking strength caused by the combustion engine battery having a bad state of charge (SOC).

It is clearly desirable for an operator or user of a combustion engine to be made aware at an early stage during which the combustion engine battery starts developing or exhibiting low cranking strength, especially caused by the battery having a bad state of health (SOH) or in the near-end-of-life (NEOL) state, prior to the inability of the battery to enable starting of the engine. Such awareness is accomplished by either periodically, or continuously, testing or monitoring (detecting, measuring, and analyzing) electrical characteristics and parameters of the combustion engine battery.

The field of testing or monitoring static and/or dynamic electrical characteristics and parameters, such as voltage or charge, current, charging/discharging, internal resistance, and temperature, of a combustion engine battery has become well developed, featuring numerous teachings of methods, devices, and systems, widely varying from relatively simple to quite complex and sophisticated. In general, methods, devices, and systems, for battery testing or monitoring, can be categorized as either 'out-of-service', or as 'in-use'. 'Out-of-service' refers to battery testing or monitoring 'while the combustion engine is not in normal or typical daily use, or, is out-of-service', by an operator of the vehicle or device powered by the combustion engine. 'In-use' refers to battery testing or monitoring 'while the combustion engine is in normal or typical daily, and day-to-day, use', by an operator of the vehicle or device powered by the combustion engine.

Out-of-service applications typically involve a properly trained technician or engine operator using a separate dedicated computerized electronic engine analyzer or diagnosis center, located external to the combustion engine hosting the battery, for testing or monitoring the battery, while the combustion engine is 'out-of-service', usually, at some kind of auto service station or center. Disclosures in U.S. Pat. No. 4,423,379 to Jacobs et al., U.S. Pat. No. 4,423,378 to Marino et al., and U.S. Pat. No. 4,322,685 to Frailing et al., teach of out-of-service methods, devices, and systems. In each of these teachings, an externally generated electrical load is applied to the battery for determining the state or condition of the battery.

Out-of-service applications are advantageous for performing complex and thorough testing or monitoring of a combustion engine battery regarding its functioning in relation to the combustion engine, while the vehicle or device powered by the combustion engine is out-of-service, but, by definition, cannot be used for distinguishing among the above described different reasons a combustion engine develops or exhibits low cranking strength while the vehicle or device is in-use, since they are not applicable for distinguishing between a bad state of health (SOH) and a bad state of charge (SOC) of the battery while the vehicle or device is in use. Accordingly, out-of-service applications cannot be used for in-use unambiguously determining low cranking strength caused by the combustion engine battery having a bad state of health (SOH) or in the 'near-end-of-life' (NEOL) state.

As previously stated hereinabove, the present invention is directed to in-use monitoring (detecting, measuring, and analyzing) and determining the electrical condition of a battery of a 'combustion engine', being an engine powered by the burning or combusting of a fuel and includes a starting system or mechanism functioning for cranking a crankshaft for starting the combustion engine, and a charging system or mechanism which automatically recharges the battery of the combustion engine following starting of the combustion engine.

In the art, there are also teachings about in-use determining the electrical condition of a battery of a 'non-combustion' engine, such as a 'battery powered' engine operative 'without' a cranking type of starting system or mechanism and 'without' an automatic battery charging system or mechanism as part of the battery powered engine. For example, in U.S. Pat. No. 4,193,026 issued to Finger et al., a device and method are disclosed for measuring the state of charge (SOC) of a battery of a battery powered (non-combustion) device, during its discharge from a charged condition, during operation and use of the device, including a means for monitoring voltage output, a pulse generator, a means for counting or integrating generated pulses, and a means for producing a warning signal according to at least one pre-determined threshold level of rate of drop in battery voltage during the discharge time interval.

The invention disclosed by Finger et al. is clearly not obviously applicable to the scope and objectives of the present invention, for the following reasons. As disclosed therein, the invention of Finger et al. " . . . is especially useful for monitoring rechargeable storage batteries such as those used in battery powered vehicles which may include various battery powered tools, such as fork lifts or the like, and it will be described in detail in this context." The invention of Finger et al. is strictly applicable to monitoring the electrical condition of a battery of a 'battery powered' device, and is not applicable to monitoring the electrical condition of a battery operative as part of a 'combustion powered' device or engine including a cranking type of starting system or mechanism and including an in-use charging system or mechanism which automatically recharges the combustion engine battery following starting of the combustion engine.

The invention of Finger et al. is specifically implemented for indicating to a user when there is a need for recharging the discharged battery of the battery powered (non-combustion) device. In the disclosure of Finger et al. there is no description or suggestion relating to monitoring (detecting, measuring, and analyzing) low cranking strength of a battery, regardless of whether the cause of the low cranking strength is due to a bad state of health (SOH) or due to a bad state of charge (SOC), since the invention of Finger et al. describes monitoring of a battery powered (non-combustion) device operating entirely without a cranking type of starting system or mechanism and without an in-use charging system or mechanism. Therein are provided no means for distinguishing among the different causes of the development or exhibition of low cranking strength of a combustion engine battery. Accordingly, the invention of Finger et al. cannot be used for in-use unambiguously determining the near-end-of-life (NEOL) state of a combustion engine battery.

Following are brief summaries of several selected prior art disclosures teaching about 'in-use' automatically monitoring and determining the electrical condition of a combustion engine battery.

Disclosures by Palanisamy in U.S. Pat. Nos. 5,281,919; 4,968,942; and 4,937,528, feature methods and apparatus applicable as part of an engine, for 'in-use' determining battery capacity, state of charge (SOC), and certain fault conditions. In these disclosures, ambient temperature, battery voltage, alternator/regulator output voltage, and current to and from the battery are continuously measured. Current-voltage (I-V) data is analyzed to determine the internal resistance and polarization of the battery. A microprocessor is used for programming a test current or voltage provided to the battery by the alternator/regulator.

In U.S. Pat. No. 5,339,017 to Yang, there is described a device for checking the state of charge (SOC) of a vehicle battery, featuring indirectly measuring internal resistance of the battery by measuring voltage of a capacitor charged by the battery. At higher capacitor voltage, internal resistance of the battery is lower, and the state of charge (SOC) of the battery is considered inside the rated working range. The device provides visual display of capacitor voltage, thereby indicating battery internal resistance, which in turn shows the state of charge (SOC) of the battery.

In U.S. Pat. No. 3,997,888 issued to Kremer, a device is described for in-use monitoring the state of charge (SOC) of a battery during engine operation, featuring a voltage divider, a resistive bridge circuit, a current sensor, an operational amplifier, and a detector. During battery discharge, a reduction of battery voltage unbalances the resistive bridge circuit causing an opposite sense voltage compensation proportional to the discharge current measured by the current sensor. The device can also operate with a timer, a pulse generator, and a pulse counter for selectively actuating the detector, according to a pre-determined threshold level of drop in battery voltage, for establishing an alarm condition corresponding to battery discharge.

In U.S. Pat. No. 4,665,370 to Holland, there is disclosed a method and apparatus for testing a combustion engine battery during engine starting. During each engine starting, the battery tester compares the unloaded voltage of the battery with the voltage under load, where the load is supplied by the cranking motor. Indication of low battery charge is based on analyzing a single event or data point corresponding to either the voltage difference being larger than a pre-determined value, or, the battery voltage dropping below a pre-determined value.

In U.S. Pat. No. 4,731,601 to Nowakowski et al., there is disclosed a method and device for testing the condition of a combustion engine cranking system, based on periodically measuring battery voltage during cranking, along with measuring battery and engine temperatures, and comparing the measured voltage to a set of pre-determined voltage values associated with particular battery and engine temperatures during cranking.

In U.S. Pat. No. 4,943,777 to Nakamura et al., there is disclosed a device for determining the condition of a combustion engine battery during engine starting. Battery voltage is periodically measured, and a warning indication is given if the battery voltage falls below a pre-determined relatively high value for relatively short periods of time, such as three seconds, or below a pre-determined higher voltage value for longer periods of time, such as a minute or longer.

In U.S. Pat. No. 5,818,333 to Yaffe et al., there is disclosed a device and method for in-use measuring voltage levels of a combustion engine battery and warning when the battery is about to run out, but is still able to start a vehicle motor, thereby allowing a vehicle operator to continue driving the vehicle, and prepare for timely replacement of the battery. The disclosed device includes a voltage level tester for measuring battery voltage at the end of a given engine starting time interval, a timer responsive to activation of a starter mechanism to time the given engine starting time interval, a counter for maintaining an incremental count of occasions on which the battery voltage is below a given level, and an alarm for providing a warning signal when the incremental count exceeds a pre-determined number of counts. In a preferred embodiment, the voltage level tester continuously measures the voltage across the battery, and the timer identifies activation of the starter mechanism by a corresponding sudden drop in voltage across the battery. In the disclosure of Yaffe et al., the warning signal, in the form of an audible alarm or visual signal, activates when the incremental count exceeds a given number, following, but not including, activation of the starter mechanism or motor.

Limitations relating to the combustion engine operator receiving and/or noticing the warning signal during implementation of the device and method of Yaffe et al. are successfully overcome in an improved device and method for measuring and warning of vehicle battery deterioration, disclosed by the same inventors, Zur et al., in U.S. Pat. No. 6,091,325. The disclosed device includes the same components as the device of the previous disclosure of Yaffe et al., and as the improvement, additionally includes components and steps for distinguishing between engine activation and engine non-activation, where engine non-activation includes engine turn-off, whereby the alarm activates for providing an additional warning signal of battery deterioration following engine turn-off. Accordingly, the warning signal activates a first time when the incremental count of below level battery voltage exceeds a given number following, but not including, activation of the starter mechanism or motor, and activates a second time when an engine characteristic level tester registers engine noise and/or vibration less than a threshold level corresponding to engine turn-off, so as to provide the vehicle operator an additional warning of battery charge deterioration, regardless of whether the first warning signal was actuated, noticed or heard.

Prior art techniques of in-use monitoring (detecting, measuring, and analyzing) and indicating the condition of a combustion engine battery are typically based upon measuring and analyzing electrical changes, focusing on detecting significant drops in battery voltage, relative to a reference voltage, without steps and/or components for detecting and logically analyzing a plurality of voltage changes generated specifically during activation of the starter mechanism 'from initiation of, and during, engine starting', and therefore, are limited in accuracy and precision with respect to in-use monitoring and indicating cranking strength of the battery during engine starting. Moreover, such prior art techniques are absent of means for unambiguously distinguishing among the above described different causes, relating to a bad state of health (SOH) or to a bad state of charge (SOC), of the development or exhibition of low cranking strength of a combustion engine battery. Accordingly, such prior art techniques are not obviously applicable for in-use unambiguously determining the near-end-of-life (NEOL) state of a combustion engine battery.

In PCT International Patent Application No. US01/25596, filed Aug. 16, 2001, claiming priority from U.S. patent application Ser. No. 09/685,004, filed Oct. 06, 2000, by the same inventors of the present invention, both specifications of which are incorporated herein by reference, there is disclosed a method and device for in-use detecting low cranking strength of a combustion engine battery during engine starting. Implementation of the method and device of that invention are based on continuously integrating changes in battery voltage specifically 'during engine starting', from the time the electromechanical starting load is initially applied to the battery, and logically analyzing values of the integrated changes in battery voltage during engine starting, for determining whether or not there is an initial stage of developing low cranking strength of the battery.

The generalized first preferred embodiment 10 of that disclosed invention (illustrated in FIG. 1, therein and herein) is initially implemented by integrating 'logic' values generated by a comparator which compares and assigns logic values to changes in battery voltage relative to a constant reference voltage, for forming an output signal of an integrator which is sent to a detector, during engine starting. The generalized second preferred embodiment 15 of that disclosed invention (illustrated in FIG. 2, therein and herein) is initially implemented by integrating 'analog' values of changes in battery voltage relative to constant reference voltage, without first comparing the voltage changes by a comparator, for forming an output signal of an integrator which is sent to a detector, during engine starting. Specific embodiments of the invention disclosed therein include a counter reset mechanism, as part of a counter reset sub-circuit (70 in FIGS. 1 and 2), for resetting a counter which counts the number of occurrences of detecting changes in battery voltage corresponding to low cranking strength of the battery during engine starting.

Implementation of that disclosed invention is insufficient for 'unambiguously distinguishing' among the above described different causes of the development or exhibition of low cranking strength of a combustion engine battery, with respect to the distinct differences between a bad state of health (SOH) and a bad state of charge (SOC) of the combustion engine battery. More specifically, that invention is absent of steps and means for in-use 'multi-level' monitoring (detecting, measuring, and analyzing) the starting history of the combustion engine, associated with performance of the battery while starting the engine, in terms of changes in battery voltages during engine starting as a function of the number of engine startings, and is absent of steps and means for in-use monitoring the operational relationship between the combustion engine battery and the charging system or mechanism (generator or alternator).

To date, in the field of automatically monitoring and determining the electrical condition of a combustion engine battery, there remains an on-going need for providing an accurate and reliable technique for in-use unambiguously determining, and indicating, the near-end-of-life (NEOL) state of a combustion engine battery. Moreover, there is a need for such an invention which accomplishes this by unambiguously distinguishing, and indicating, among the above described different causes of the development or exhibition of low cranking strength of a combustion engine battery, with respect to the distinct differences between a bad state of health (SOH) and a bad state of charge (SOC) of the combustion engine battery. It is also desirable to have such an invention additionally including steps and components for controlling activation of an indicating mechanism, for providing in-use indication of the near-end-of-life (NEOL) state of the combustion engine battery. Moreover, it is highly desirable to have such an invention which is accurate, reliable, and relatively simple and inexpensive to implement in essentially any type of combustion engine.

SUMMARY OF THE INVENTION

The present invention relates to a method and device for in-use unambiguously determining and indicating the near-end-of-life (NEOL) state of a combustion engine battery. The present invention features means for in-use unambiguously distinguishing, and indicating, among different causes of the development or exhibition of low cranking strength of a combustion engine battery, with respect to the distinct differences between a bad state of health (SOH) and a bad state of charge (SOC) of the combustion engine battery, and additionally includes steps and components for controlling activation of an indicating mechanism, for providing in-use indication of the near-end-of-life (NEOL) state of the combustion engine battery.

Thus, according to the present invention, there is provided a method for in-use unambiguously determining the near-end-of-life state of a combustion engine battery, the combustion engine battery providing electrical power for cranking a crankshaft for starting the combustion engine and is automatically recharged by a charging system of the combustion engine following engine starting, the method comprising the steps of: (a) counting a first number of occurrences of low cranking strength exhibited by the battery, for a plurality of engine startings, via operative connection of a first multi-functional module, operating with a first set of low cranking strength criteria, to a logic function linking group, the first set of low cranking strength criteria is based on using value of a first reference voltage; (b) substantially simultaneous to step (a), counting a second number of the occurrences of low cranking strength exhibited by the battery, for same plurality of engine startings of step (a), via operative connection of a second multi-functional module, operating with a second set of low cranking strength criteria, to the logic function linking group, the second multi-functional module is operatively connected in parallel to the first multi-functional module, the second set of low cranking strength criteria is based on using value of a second reference voltage, whereby the value of the second reference voltage is different from the value of the first reference voltage; (c) monitoring extent to which the battery was recharged, in terms of voltage supplied, by the charging system of the combustion engine during previous operation of the combustion engine, via additional operative parallel connection of a third multi-functional module to the logic function linking group operative with the first and the second multi-functional modules, during each engine starting; and (d) unambiguously determining a single logically correct specific case, from a plurality of different logically correct specific cases, associated with the combustion engine battery in, or not in, the near-end-of-life state, by the logic function linking group performing logic operations and making decisions using simultaneously received output values of the first, the second, and the third, multi-functional modules, during each engine starting.

According to further features in preferred embodiments of the method of the invention described below, in step (d) there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting.

According to further features in preferred embodiments of the method of the invention described below, in step (d) there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting, whereby three of the four different logically correct specific cases specifically relate to the combustion engine battery not in the near-end-of-life state.

According to further features in preferred embodiments of the method of the invention described below, in step (d) there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting, whereby one of the four different logically correct specific cases specifically and uniquely relates to the combustion engine battery in the near-end-of-life state.

According to further features in preferred embodiments of the method of the invention described below, in step (d) one of the plurality of different logically correct specific cases specifically and uniquely relates to the combustion engine battery in the near-end-of-life state, according to one unique combination of output values of operatively connected logic elements of the logic function linking group and different values of the simultaneously received output values of the first, the second, and the third, multi-functional modules, during each engine starting, corresponding to normal recharging of the battery by the charging system of the combustion engine, and corresponding to the battery exhibiting low, or less than normal, cranking strength during engine starting.

According to further features in preferred embodiments of the method of the invention described below, the method further includes step (e) of indicating the unambiguously determined single logically correct specific case, from the plurality of the different logically correct specific cases, associated with the combustion engine battery in, or not in, the near-end-of-life state, by an indicating mechanism operatively connected to the logic function linking group. The type of the indicating performed by the indicating mechanism is selected from the group consisting of an audible type of indicating, a visual type of indicating, and a combination thereof.

According to another aspect of the present invention, there is provided a device for in-use unambiguously determining the near-end-of-life state of a combustion engine battery, the combustion engine battery providing electrical power for cranking a crankshaft for starting the combustion engine and is automatically recharged by a charging system of the combustion engine following engine starting, comprising: (a) a first multi-functional module, operating with a first set of low cranking strength criteria, operatively connected to a logic function linking group, for counting a first number of occurrences of low cranking strength exhibited by the battery, for a plurality of engine startings, the first set of low cranking strength criteria is based on using value of a first reference voltage; (b) a second multi-functional module, operating with a second set of low cranking strength criteria, operatively connected to the logic function linking group and operatively connected in parallel to the first multi-functional module, for counting a second number of the occurrences of low cranking strength exhibited by the battery, substantially simultaneous to step (a), for same plurality of engine startings of step (a), the second set of low cranking strength criteria is based on using value of a second reference voltage, whereby the value of the second reference voltage is different from the value of the first reference voltage; (c) a third multi-functional module, additionally operatively parallel connected to the logic function linking group operative with the first and the second multi-functional modules, for monitoring extent to which the battery was recharged, in terms of voltage supplied, by the charging system of the combustion engine during previous operation of the combustion engine, during each engine starting; and (d) the logic function linking group, for performing logic operations and making decisions using simultaneously received output values of the first, the second, and the third, multi-functional modules, for unambiguously determining a single logically correct specific case, from a plurality of different logically correct specific cases, associated with the combustion engine battery in, or not in, the near-end-of-life state, during each engine starting.

According to further features in preferred embodiments of the device of the invention described below, there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting.

According to further features in preferred embodiments of the device of the invention described below, there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting, whereby three of the four different logically correct specific cases specifically relate to the combustion engine battery not in the near-end-of-life state.

According to further features in preferred embodiments of the device of the invention described below, there is a plurality of four different logically correct specific cases associated with the combustion engine battery in, or not in, the near-end-of-life state, according to four different combinations of output values of operatively connected logic elements of the logic function linking group and different values of the simultaneously received output values of the first, the second, and the third, multi-functional modules, during each engine starting, whereby one of the four different logically correct specific cases specifically and uniquely relates to the combustion engine battery in the near-end-of-life state.

According to further features in preferred embodiments of the device of the invention described below, one of the plurality of different logically correct specific cases specifically and uniquely relates to the combustion engine battery in the near-end-of-life state, according to one unique combination of output values of operatively connected logic elements of the logic function linking group and different values of the simultaneously received output values of the first, the second, and the third, multi-functional modules, during each engine starting, corresponding to normal recharging of the battery by the charging system of the combustion engine, and corresponding to the battery exhibiting low, or less than normal, cranking strength during engine starting.

According to further features in preferred embodiments of the device of the invention described below, the device further includes (e) an indicating mechanism operatively connected to the logic function linking group for indicating the unambiguously determined single logically correct specific case, from the plurality of the different logically correct specific cases, associated with the combustion engine battery in, or not in, the near-end-of-life state. The type of the indicating performed by the indicating mechanism is selected from the group consisting of an audible type of indicating, a visual type of indicating, and a combination thereof.

Implementation of the method and device of the present invention involves performing steps and sub-steps in a manner selected from the group consisting of manually, semi-automatically, fully automatically, and a combination thereof, and involves operation of components, mechanisms, and elements, in a manner selected from the group consisting of manual, semi-automatic, fully automatic, and a combination thereof. Moreover, according to actual steps and sub-steps, components, mechanisms, and elements, used for implementing a particular embodiment of the disclosed invention, steps and sub-steps are performed by using hardware, software, or an integrated combination thereof, and, components, mechanisms, and elements, operate by using hardware, software, or an integrated combination thereof.

In particular, software used for implementing the present invention features operatively connected and functioning written or printed data, in the form of software programs, software routines, software sub-routines, software symbolic languages, software code, software instructions or protocols, or a combination thereof. Hardware used for implementing the present invention features operatively connected and functioning electronic components and elements, in the form of a computer chip, an integrated circuit, an electronic circuit, an electronic sub-circuit, a hard-wired circuit, or a combination thereof, involving digital and/or analog operations. Accordingly, an integrated combination of (1) software and (2) hardware, used for implementing the present invention, features an integrated combination of (1) operatively connected and functioning written or printed data, in the form of software programs, software routines, software sub-routines, software symbolic languages, software code, software instructions or protocols, or a combination thereof, and (2) operatively connected and functioning electronic components and elements, in the form of a computer chip, an integrated circuit, an electronic circuit, an electronic sub-circuit, a hard-wired circuit, or a combination thereof, involving digital and/or analog operations.

BRIEF DESCRIPTION OF THE DRAWINGS

The present invention is herein described, by way of example only, with reference to the accompanying drawings. With specific reference now to the drawings in detail, it is stressed that the particulars shown are by way of example and for purposes of illustrative description of the preferred embodiments of the present invention only, and are presented in the cause of providing what is believed to be the most useful and readily understood description of the principles and conceptual aspects of the present invention. In this regard, no attempt is made to show structural details of the present invention in more detail than is necessary for a fundamental understanding of the invention, the description taken with the drawings making apparent to those skilled in the art how the several forms of the invention may be embodied in practice. In the drawings.

DESCRIPTION OF THE PREFERRED EMBODIMENTS

The present invention relates to a method and device for in-use unambiguously determining and indicating the near-end-of-life (NEOL) state of a combustion engine battery. The present invention features means for in-use unambiguously distinguishing, and indicating, among different causes of the development or exhibition of low cranking strength of a combustion engine battery, with respect to the distinct differences between a bad state of health (SOH) and a bad state of charge (SOC) of the combustion engine battery, and additionally includes steps and components for controlling activation of an indicating mechanism, for providing in-use indication of the near-end-of-life (NEOL) state of the combustion engine battery.

The present invention is directed to in-use monitoring (detecting, measuring, and analyzing) and determining the electrical condition of a battery of a 'combustion engine', being an engine powered by the burning or combusting of a fuel and includes a starting system or mechanism functioning for cranking a crankshaft for starting the combustion engine, and a charging system or mechanism which automatically recharges the battery of the combustion engine following starting of the combustion engine. The combustion engine may be part of a vehicle, where a vehicle may be any mobile device powered by the combustion engine for carrying or transporting persons or objects of any kind, for example, an automobile, truck, farm vehicle such as a tractor or cotton combine, train, airplane, or boat. The combustion engine may also be part of a stand alone device, such as an electrical generator, a cement mixer, or a heavy duty power machine.

The present invention is a continuation-in-part of the 'parent' invention disclosed in PCT International Patent Application No. US01/25596, filed Aug. 16, 2001, entitled: "Method And Device For In-use Detecting Low Cranking Strength Of A Combustion Engine Battery During Engine Starting", claiming priority from U.S. patent application Ser. No. 09/685,004, filed Oct. 06, 2000 now U.S. Pat. No. 6,646,561, both specifications of which are incorporated herein by reference.

Implementation of the above indicated 'parent' invention is based on continuously integrating changes in battery voltage specifically 'during engine starting', from the time the electro-mechanical starting load is initially applied to the battery, and logically analyzing values of the integrated changes in battery voltage during engine starting, for determining whether or not there is an initial stage of developing low cranking strength of the battery.

Figure 1:
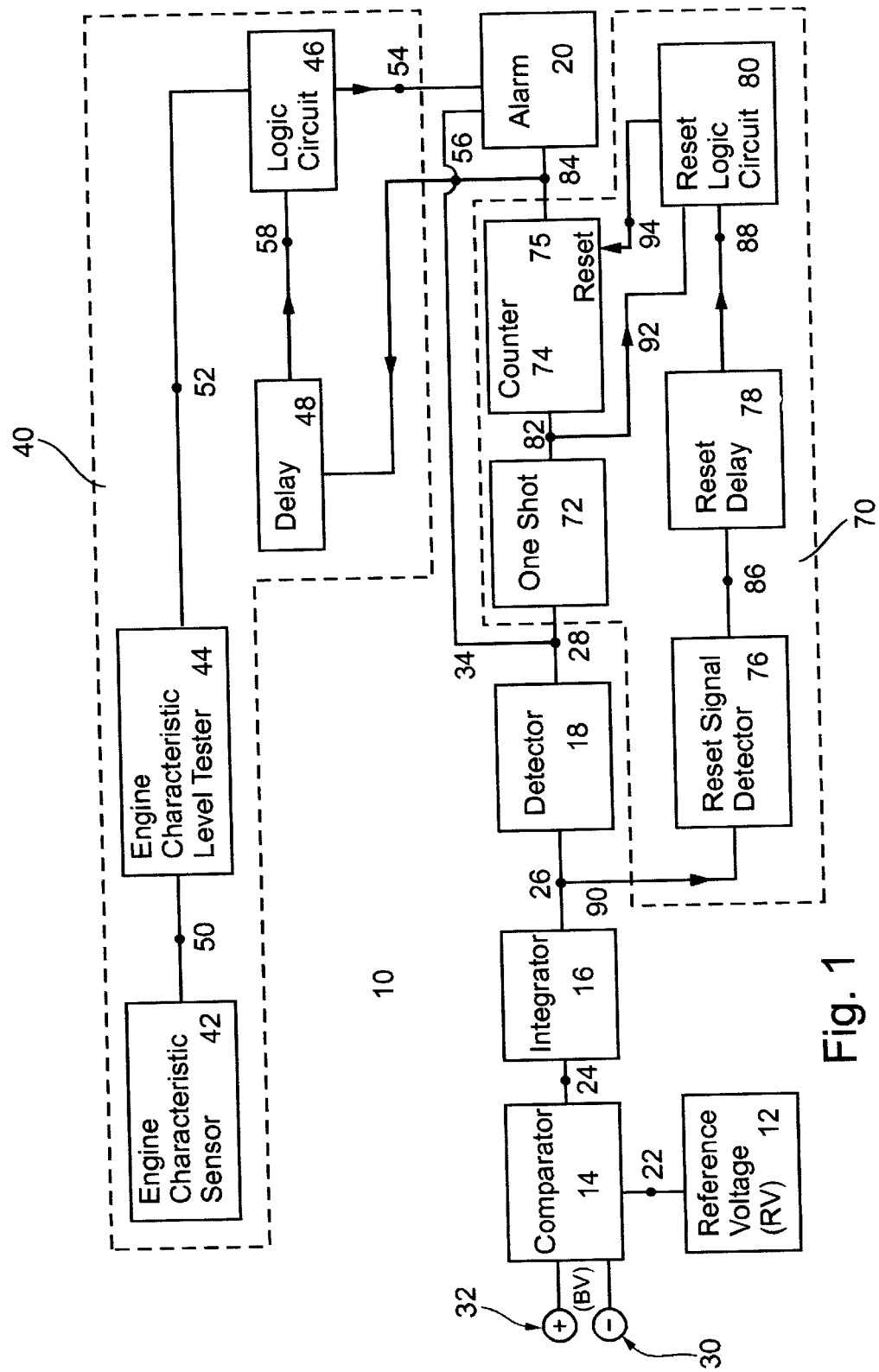
FIG. 1 is a schematic flow and block diagram illustrating the first preferred embodiment 10 of the 'parent' invention disclosed in PCT International Patent Application No. US01/25596, also showing features (indicated by dashed line enclosures) of a 'following engine turn-off warning sub-circuit' 40, and a 'counter reset sub-circuit' 70.

The generalized first preferred embodiment 10 of the disclosed 'parent' invention (illustrated in FIG. 1, therein and herein, also showing features (indicated by dashed line enclosures) of a 'following engine turn-off warning sub-circuit' 40, and a 'counter reset sub-circuit' 70) is initially implemented by integrating logic values generated by a comparator which compares and assigns logic values to changes in battery voltage relative to a constant reference voltage (RV), during engine starting. A specific form of the first preferred embodiment 10 therein features (a) sensing time varying voltage (BV) of the battery by a comparator 14, from initiation of and during the engine starting; (b) comparing the time varying voltage of the battery to a constant reference DC voltage (RV) 12 by the comparator 14, for forming a plurality of output signals of the comparator 14, from the initiation of and during the engine starting; (c) integrating the plurality of the output signals of the comparator 14 by an integrator 16, for forming an output signal of the integrator 16, during the engine starting; followed by steps (d) through (j) written herein below, which are the same steps performed for implementing a corresponding specific form of the following summarized second preferred embodiment 15 therein.

Figure 2:
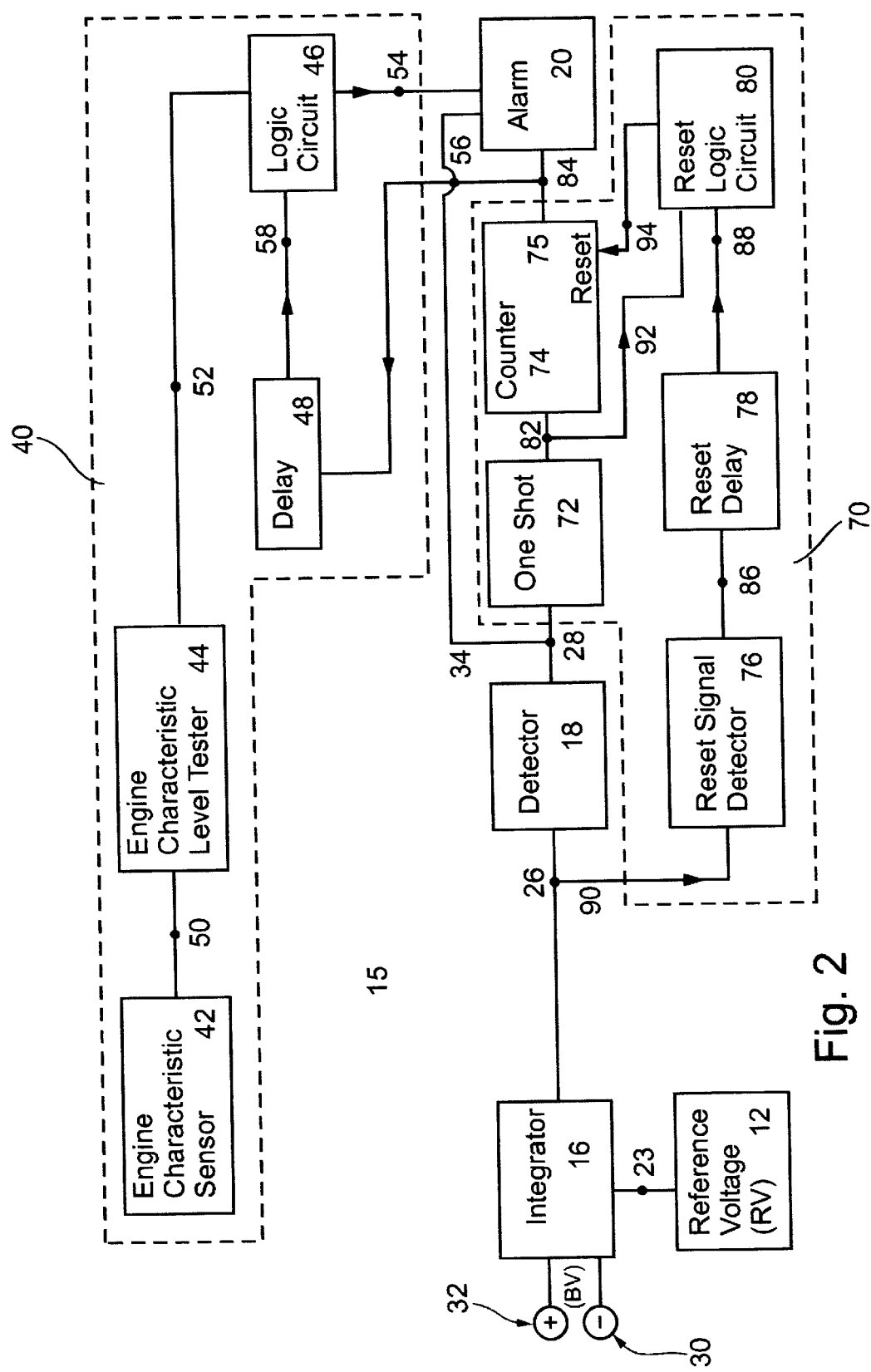
FIG. 2 is a schematic flow and block diagram illustrating the second preferred embodiment 15 of the 'parent' invention disclosed in PCT International Patent Application No. US01/25596, also showing features (indicated by dashed line enclosures) of 'following engine turn-off warning sub-circuit' 40, and 'counter reset sub-circuit' 70.

The generalized second preferred embodiment 15 of the disclosed 'parent' invention (illustrated in FIG. 2, therein and herein, also showing features (indicated by dashed line enclosures) of a 'following engine turn-off warning sub-circuit' 40, and a 'counter reset sub-circuit' 70) is initially implemented by integrating 'analog' values of changes in battery voltage relative to constant reference voltage, without first comparing the voltage changes by a comparator, during engine starting. A specific form of the second preferred embodiment 15 therein features (a) sensing time varying voltage (BV) of the battery by an integrator 16, from initiation of and during the engine starting; (b) evaluating time varying difference between the time varying voltage of the battery and a constant reference DC voltage (RV) 12 by the integrator 16, for forming a plurality of evaluated voltage differences, from the initiation of and during the engine starting; (c) integrating the plurality of the evaluated voltage differences by the integrator 16, for forming an output signal of the integrator 16, during the engine starting; followed by steps (d) through (j) written immediately below, which are the same steps performed for implementing the preceding corresponding specific form of the first preferred embodiment 10 therein.

As stated above, steps (d) through (j), written immediately below, are the same steps performed for implementing each preceding specific form of the first and second preferred embodiments 10 and 15, respectively, of the 'parent' invention:

(d) determining and responding to the output signal of the integrator 16 by a detector 18, for forming an output signal of the detector 18, during the engine starting; (e) determining and responding to the output signal of the detector 18 by a one shot 72, for forming an output signal of the one shot 72, during the engine starting; (f) determining and responding to the output signal of the one shot 72 by a counter 74, whereupon according to the output signal of the one shot 72 the counter 74 registers a count number of occurrences of the low cranking strength of the battery, for forming an output signal of the counter 74, during the engine starting; (g) determining and responding to the output signal of the integrator 16 by a reset signal detector 76, for forming an output signal of the reset signal detector 76, substantially simultaneous to step (d) of the determining and the responding to the output signal of the integrator 16 by the detector 18, during the engine starting; (h) delaying forwarding of the output signal of the reset signal detector 76 by a reset delay 78, during the engine starting; (i) analyzing and responding to substantially simultaneous reception of the output signal of the one shot 72 and the output signal of the reset delay 78 by a reset logic circuit 80, for forming an output signal of the reset logic circuit 80, whereupon according to the output signal of the reset logic circuit 80 sent to the counter 74, response of a counter reset mechanism 75 associated with the counter 74 is selected from the group consisting of activating for resetting the count number of the counter 74 and remaining inactive by not resetting the count number of the counter 74, during the engine starting; and (j) determining and responding to the output signal of the counter 74 by an alarm 20, whereupon according to the determination by the alarm 20, the response by the alarm 20 is selected from the group consisting of remaining inactive and activating for providing an in-use warning signal of the low cranking strength of the battery to an operator of the combustion engine, at a time selected from the group consisting of during the engine starting and following the engine starting prior to engine turn-off.

Figure 3:
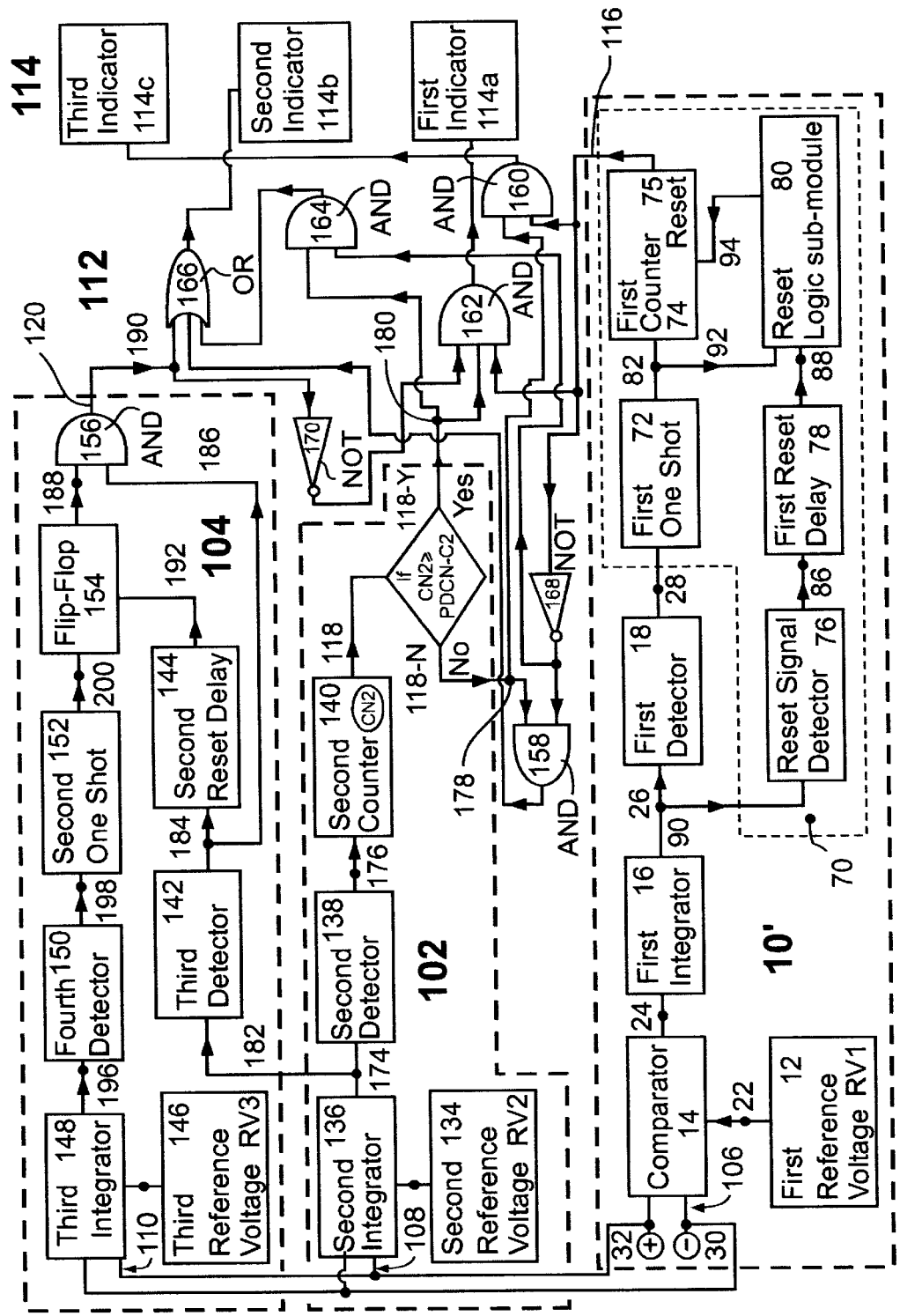
FIG. 3 is a schematic flow and block diagram illustrating the first preferred embodiment 100 of the method and device of the present invention, featuring operative parallel connection, and multi-level operation, of three (electronic/software) multi-functional modules: first multi-functional module 10', second multi-functional module 102, and third multi-functional module 104, with a logic function linking group 112 and an indicating mechanism 114.
Figure 4:
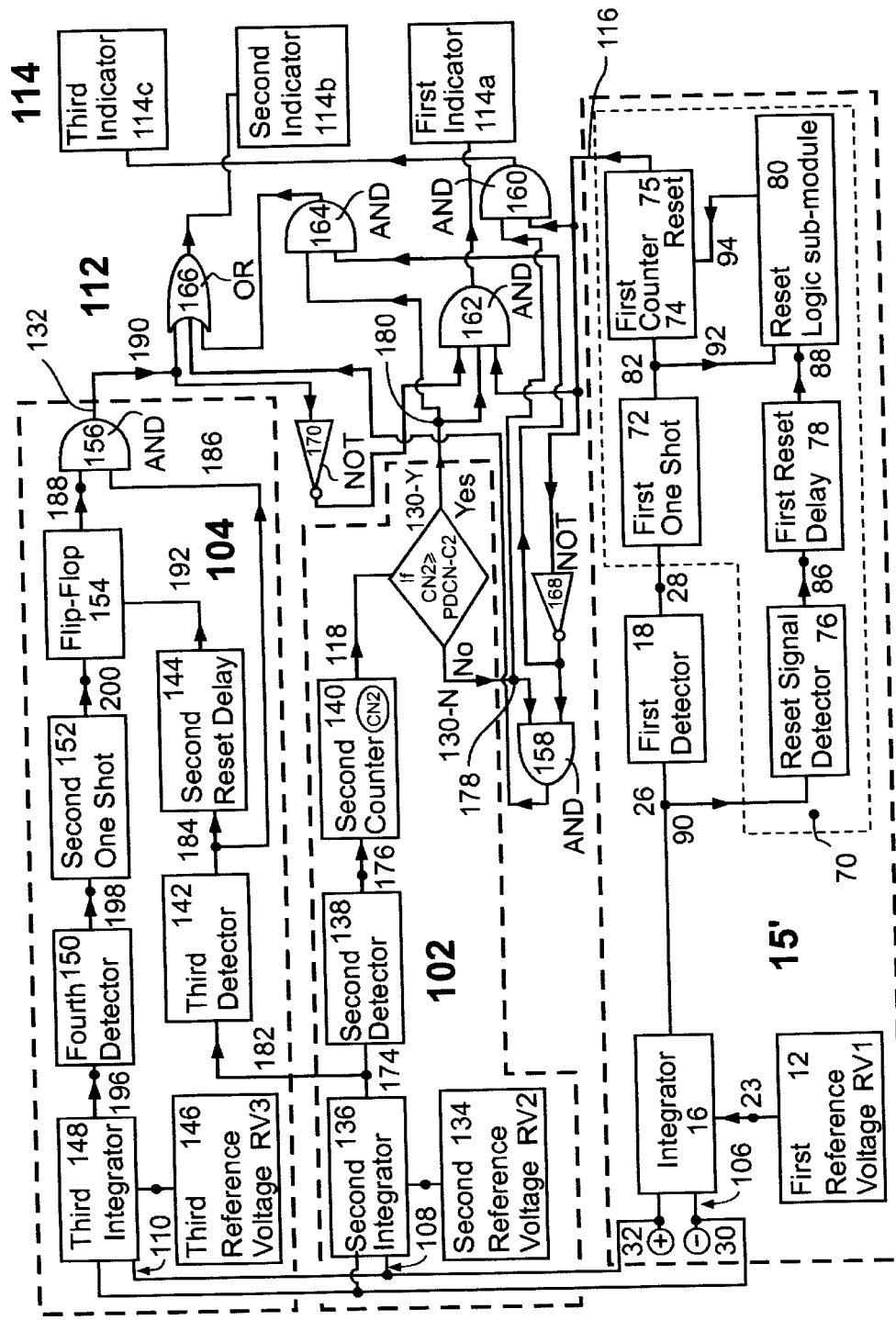
FIG. 4 is a schematic flow and block diagram illustrating the second preferred embodiment 200 of the method and device of the present invention, featuring operative parallel connection, and multi-level operation, of three (electronic/software) multi-functional modules: first multi-functional module 15', second multi-functional module 102, and third multi-functional module 104, with a logic function linking group 112 and an indicating mechanism 114.

A unique feature of the above described specific forms of the first and second preferred embodiments 10 and 15, respectively, of the 'parent' invention, is inclusion and operation of the counter reset mechanism, as part of the counter reset sub-circuit 70 (FIGS. 1 and 2), for resetting the counter 74 which counts the number of occurrences of detecting changes in battery voltage corresponding to low cranking strength of the battery during engine starting. As described hereinbelow, the first and second preferred embodiments 100 and 200, respectively, of the present invention, also feature inclusion and operation of the previously disclosed counter reset mechanism, as part of a counter reset sub-module 70 (FIGS. 3 and 4).

As stated above, currently, in the field of automatically monitoring and determining the electrical condition of a combustion engine battery, there remains an on-going need for providing an accurate and reliable technique for in-use unambiguously determining, and indicating, the near-end-of-life (NEOL) state of a combustion engine battery. Moreover, there is a need for such an invention which accomplishes this by unambiguously distinguishing, and indicating, among the different causes (previously described in the Field and Background section, above) of the development or exhibition of low cranking strength of a combustion engine battery, with respect to the distinct differences between a bad state of health (SOH) and a bad state of charge (SOC) of the combustion engine battery.

Implementation of the disclosed 'parent' invention is insufficient for unambiguously distinguishing among the above described different causes of the development or exhibition of low cranking strength of a combustion engine battery, with respect to the distinct differences between a bad state of health (SOH) and a bad state of charge (SOC) of the combustion engine battery. More specifically, that invention is absent of steps and means for in-use 'multi-level' monitoring (detecting, measuring, and analyzing) the starting history of the combustion engine, associated with performance of the battery while starting the engine, in terms of changes in battery voltages during engine starting as a function of the number of engine startings, and is absent of steps and means for in-use monitoring the operational relationship between the combustion engine battery and the charging system or mechanism (generator or alternator).

The 'parent' invention clearly fulfills the objective and function of in-use detecting low cranking strength of a combustion engine battery during engine starting, even though the specific origin or cause of the detected low cranking strength of the battery is not unambiguously identified or analyzed. Given an accurate and reliable technique for in-use detecting of low cranking strength of the combustion engine battery during engine starting, as disclosed in the 'parent' invention, the inventors of the 'parent' invention determined that it is logical to continue from that point or stage of implementation, by adding appropriate steps and means to the 'parent' invention, for fulfilling the main objective and function of the present invention of in-use unambiguously determining the near-end-of-life (NEOL) state of a combustion engine battery.

A general aspect of novelty and inventiveness of the present invention is that it is implemented for unambiguously determining the near-end-of-life (NEOL) state of a combustion engine battery, at any time the combustion engine battery is 'in-use'. The present invention is based on automatically monitoring (detecting, measuring, and analyzing) the starting history of the combustion engine, associated with performance of the battery while starting the engine, in terms of changes in battery voltages during engine starting as a function of the number of engine startings, and 'not' as a function of the chronological or physical age of the battery, or period of time (for example, number of months or years) during which the battery is in use or operation, as part of the combustion engine. This unique monitoring is performed by operative parallel connection, and multi-level combined operation, of at least three (electronic/software) multi-functional modules with a logic function linking group, during each engine starting, for a plurality of engine startings.

This monitoring is done by defining and using a unique 'implicit' electrical parameter, herein, referred to as P(engine starting history). The implicit electrical parameter, P(engine starting history), is defined as, and evaluated from, the ratio of (1) the difference ($\Delta$) between battery voltage (BV) at two engine startings to (2) the number of engine startings (N) between the two engine startings. Herein, this implicit electrical parameter, P(engine starting history), is symbolically written and referred to as ($\Delta$V)/(N).

'Starting history' of the combustion engine means that monitoring of the starting history of the combustion engine, in general, and of the combustion engine battery, in particular, by way of evaluating and using values of P(engine starting history), is preferably performed by evaluating and using values of battery voltage differences ($\Delta$V) and number of engine startings (N) associated with 'non-consecutive' engine startings, that is, associated with two engine startings between which a plurality of engine startings took place. $\Delta$V is evaluated from the difference between values, RV1 and RV2, that is RV2–RV1, of two reference voltages included in each of at least two (electronic/software) multi-functional modules operatively parallel connected and substantially simultaneously operative for in-use automatic multi-level monitoring (detecting, measuring, and analyzing) the cranking strength of the battery, during each engine starting, for a plurality of engine startings.

A first specific aspect of novelty and inventiveness of the present invention, is that during implementation there is in-use automatic multi-level monitoring (detecting, measuring, and analyzing) the cranking strength of the battery, during each engine starting, for a plurality of engine startings. This specific monitoring is done by multi-level counting of the number of occurrences of low cranking strength exhibited by the battery, during each engine starting, for a plurality of engine startings, via operative parallel connection and substantially simultaneous operation of a first (electronic/software) multi-functional module operating with a first set of low cranking strength criteria and a second (electronic/software) multi-functional module operating with a second set of low cranking strength criteria, with a logic function linking group.

The first set of low cranking strength criteria is based on using the value (RV1) of a first reference voltage, while the second set of low cranking strength criteria is based on using the value (RV2) of a second reference voltage, whereby the value (RV2) of the second reference voltage is different from the value (RV1) of the first reference voltage.

The first criterion of two criteria in the first set of low cranking strength criteria corresponds to a first integrator output signal being equal to or greater than a pre-determined value (PDV-D1) of a first detector. The second criterion in the first set of low cranking strength criteria corresponds to a first counter registering a count number equal to or greater than a pre-determined count number (PDCN-C1) of the first counter. The first criterion of two criteria in the second set of low cranking strength criteria corresponds to a second integrator output signal being equal to or greater than a pre-determined value (PDV-D2) of a second detector. The second criterion in the second set of low cranking strength criteria corresponds to a second counter registering a count number (CN2) equal to or greater than a pre-determined count number (PDCN-C2) of the second counter.

A second specific aspect of novelty and inventiveness of the present invention, is that during implementation there is in-use automatically monitoring (detecting, measuring, and analyzing), the extent (that is, sufficient extent or insufficient extent) to which the battery was recharged by the charging system or mechanism of the combustion engine during the previous operation or use of the combustion engine, via additional operative parallel connection, and combined operation, of a third (electronic/software) multi-functional module with the logic function linking group, operative with the first and second (electronic/software) multi-functional modules, during the initial stage (typically, within 1 second) of each combustion engine starting.

Accordingly, implementation of the present invention also involves in-use unambiguously determining, during each engine starting, the extent to which the charging system or mechanism functioned, or malfunctioned, during the previous operation or use of the combustion engine. Monitoring (detecting, measured, and analyzed) the extent to which the battery is recharged by the charging system or mechanism is performed in terms of magnitude of voltage supplied by the charging system or mechanism (that is, via the alternator or generator) to the battery during operation or use of the combustion engine.

A third specific aspect of novelty and inventiveness of the present invention, is that during implementation, according to results of steps and operations performed and completed in parallel and/or in series, via operative connection and combined operation of the first, second, and third (electronic/software) multi-functional modules with the logic function linking group, involving various logic operations and decisions, there is in-use unambiguously determining a single logically correct specific case, from a plurality of different logically correct specific cases, associated with the combustion engine battery in, or not in, the near-end-of-life (NEOL) state, during each engine starting. The logic function linking group performs logic operations and makes decisions using simultaneously received output values of the first, second, and third (electronic/software) multi-functional modules, for determining the single logically correct specific case, from the plurality of different logically correct specific cases, associated with the combustion engine battery in, or not in, the near-end-of-life (NEOL) state, during each engine starting.

An indicating mechanism, operatively connected to the logic function linking group, is activated for indicating the single logically correct specific case, from the plurality of different logically correct specific cases, associated with the combustion engine battery in, or not in, the near-end-of-life (NEOL) state.

Based upon the above indicated aspects of novelty and inventiveness, the present invention successfully addresses many significant limitations, and widens the scope, of presently known techniques of automatically monitoring and determining the electrical condition of a combustion engine battery. Implementation of the present invention removes the ambiguity arising whenever a combustion engine battery having a bad state of health (SOH) exhibits low cranking strength in a manner similar to a combustion engine battery having a bad state of charge (SOC), and vice versa.

Moreover, implementation of the present invention unambiguously provides an operator or user of a combustion engine with the correct action to take in the event the combustion engine battery either develops or exhibits low cranking strength, with regard to either replacing the combustion engine battery having a bad state of health (SOH) and in the 'near-end-of-life' (NEOL) state, prior to the battery reaching the end of its life or becoming dead, or, simply recharging the combustion engine battery having a bad state of charge (SOC) and still having a good state of health (SOH). Furthermore, the present invention is accurate, reliable, commercially applicable, and, relatively simple and inexpensive to implement in essentially any type of combustion engine.

It is to be understood that the present invention is not limited in its application to the details of the order or sequence, and number, of steps of operation or implementation of the method, or to the details of type, composition, construction, arrangement, order, and number, of the components and elements of the device, set forth in the following description and accompanying drawings. The invention is capable of other embodiments or of being practiced or carried out in various ways. For example, any number of the electronic components or elements featured or included in the following described embodiments of the method and device may be either digital or analog, operatively connected and functioning in a corresponding digital or analog mode. Moreover, any connection among any number of the electronic components or elements of the device may be formed by using any combination of direct or mechanical means, and, indirect or electrical means such as in a circuit of the overall combustion engine vehicle or device electrical system, where any such mechanical and/or electrical connection may be internal or external to the engine compartment, in general, and internal or external to one or more appropriate components of the engine compartment, in particular.

It is also to be understood that unless otherwise defined, all technical and scientific words, terms, and/or phrases, used herein have either the identical or similar meaning as commonly understood by one of ordinary skill in the art to which this invention belongs. Phraseology, terminology, and, notation, employed herein are for the purpose of description and should not be regarded as limiting. Additionally, as used herein, the term "about" refers to ±10% of the associated value.

Herein, the phrase 'multi-functional module' refers to a module structured and performing multiple functions according to means selected from the group consisting of electronic means, software means, and, an integrated combination thereof. Accordingly, a multi-functional module refers to a multiple functioning module selected from the group consisting of an electronic multi-functional module, a software multi-functional module, and, an integrated combination thereof.

In particular, an electronic multi-functional module features operatively connected and multiple functioning electronic components and elements, in the form of a computer chip, an integrated circuit, an electronic circuit, an electronic sub-circuit, a hard-wired circuit, or a combination thereof, involving digital and/or analog operations. A software multi-functional module features operatively connected and multiple functioning written or printed data, in the form of software programs, software routines, software sub-routines, software symbolic languages, software code, software instructions or protocols, or a combination thereof.

Accordingly, an integrated combination of (1) an electronic multi-functional module and (2) a software multi-functional module features an integrated combination of (1) operatively connected and multiple functioning electronic components and elements, in the form of a computer chip, an integrated circuit, an electronic circuit, an electronic sub-circuit, a hard-wired circuit, or a combination thereof, involving digital and/or analog operations, and (2) operatively connected and multiple functioning written or printed data, in the form of software programs, software routines, software sub-routines, software symbolic languages, software code, software instructions or protocols, or a combination thereof.

Herein, for purpose of brevity, while maintaining clarity and preserving full meaning of the above described phrase 'multi-functional module', for describing the method and device of the present invention, the phrase 'multi-functional module' is also referred to as '(electronic/software) multi-functional module'.

Steps, sub-steps, components, elements, operation, and implementation of a method and device for in-use unambiguously determining the near-end-of-life state of a combustion engine battery, according to the present invention, are better understood with reference to the following description and accompanying drawings. Throughout the following description and accompanying drawings, like reference numbers refer to like components and elements.

In the following description of the method and system of the present invention, included are main or principal steps and sub-steps, and main or principal devices, mechanisms, components, and elements, needed for sufficiently understanding proper 'enabling' utilization and implementation of the disclosed method and system. Accordingly, description of various possible required and/or optional preliminary, intermediate, minor, steps, sub-steps, devices, mechanisms, components, and/or elements, which are readily known by one of ordinary skill in the art, and/or which are available in the prior art and technical literature relating to automatically monitoring and determining the electrical condition of a combustion engine battery, are at most only briefly indicated herein.

Two preferred embodiments of the method and device of the present invention are first briefly illustratively described immediately following. Thereafter, are illustratively described specific details, and optional features, of steps, sub-steps, components, elements, operation, and implementation, of each of the two preferred embodiments of the present invention.

Each of the first and second preferred embodiments of the method and device of the present invention, illustrated in FIGS. 3 and 4, respectively, and generally referred to as first preferred embodiment 100, and second preferred embodiment 200, respectively, includes operative connection to negative and positive battery leads, 30 and 32, respectively, during in-use operation of a combustion engine battery of a vehicle or device. Herein, the term 'in-use' refers to battery testing or monitoring 'while the combustion engine is in normal or typical daily, and, day-to-day, use', by an operator of the vehicle or device powered by the combustion engine, including prior to engine starting, while the engine operates, and following engine turn-off. This is to be clearly distinguished from 'out-of-service' applications involving a properly trained technician or engine operator using a separate dedicated computerized electronic engine analyzer or diagnosis center, located external to the combustion engine hosting the battery, for testing or monitoring the battery, while the combustion engine is 'out-of-service', usually, at some kind of auto service station or center.

The present invention operates on the principle that the combustion engine battery supplies the necessary electrical energy, in the form of voltage and current, corresponding to an electromechanical starting load, to the starter system or mechanism of the combustion engine for effecting the initial cranking of the crankshaft of the engine motor until the motor is started, and therefore, until the crankshaft continuously operates by energy supplied to the motor by the charging system or mechanism of the combustion engine (via a generator or alternator), without depending solely upon the battery.

Each of the first and second preferred embodiments 100 (FIG. 3) and 200 (FIG. 4), respectively, of the present invention, features operative parallel connection, and multilevel combined operation, of three (electronic/software) multi-functional modules, herein, generally referred to and indicated as first multi-functional module (10' in first preferred embodiment 100; 15' in second preferred embodiment 200), second multi-functional module 102, and third multi-functional module 104, with a logic function linking group 112 and an indicating mechanism 114. Each first, second, and third, multi-functional module input, indicated in FIGS. 3 and 4 by 106, 108, and 110, respectively, is connected to each other multi-functional module input in parallel, and all three multi-functional module inputs 106, 108, and 110, are together connected to the battery voltage (BV). Each first, second, and third, multi-functional module output, indicated in FIGS. 3 and 4 by 116, 118 (118-Y or 118-N), and 120, respectively, is connected to logic function linking group 112. Logic function linking group 112 is operatively connected to indicating mechanism 114.

During implementation of each of the first and second preferred embodiments 100 (FIG. 3) and 200 (FIG. 4), respectively, there is in-use automatically monitoring (detecting, measuring, and analyzing), the starting history of the combustion engine, associated with performance of the battery while starting the engine, in terms of changes in battery voltages during engine starting as a function of the number of engine startings, via operative parallel connection, and combined operation, of first multi-functional module (10' in first preferred embodiment 100; 15' in second preferred embodiment 200) and second multi-functional module 102 with logic function linking group 112. This is done by using the previously introduced 'implicit' electrical parameter, P(engine starting history), where P(engine starting history), is defined as, and evaluated from, the ratio of (1) the difference ($\Delta$) between battery voltage (BV) at two engine startings to (2) the number of engine startings (N) between the two engine startings. Implicit electrical parameter, P(engine starting history), is symbolically written and referred to as $(\Delta V)/(N)$.

With respect to implementing each of the first and second preferred embodiments 100 (FIG. 3) and 200 (FIG. 4) respectively, 'starting history' of the combustion engine means that monitoring of the starting history of the combustion engine, in general, and of the combustion engine battery, in particular, by way of evaluating and using values of P(engine starting history), is performed by evaluating and using values of battery voltage differences ($\Delta V$) and number of engine startings (N) associated with non-consecutive engine startings, that is, associated with two engine startings between which a plurality of engine startings took place.

During implementation of each of the first and second preferred embodiments 100 (FIG. 3) and 200 (FIG. 4), respectively, while there is in-use automatically monitoring (detecting, measuring, and analyzing), the starting history of the combustion engine, associated with performance of the battery while starting the engine, in terms of changes in battery voltages during engine starting as a function of the number of engine startings, as described immediately preceding, there is in-use automatically monitoring (detecting, measuring, and analyzing), during the initial stage (typically, within 1 second) of a current or instantaneous combustion engine starting, the extent (that is, sufficient extent or insufficient extent) to which the battery was recharged by the charging system or mechanism of the combustion engine during the previous operation or use of the combustion engine, via additional operative parallel connection, and combined operation, of third multi-functional module 104 with logic function linking group 112, operative with first multi-functional module (10' in first preferred embodiment 100; 15' in second preferred embodiment 200) and second multi-functional module 102, during each engine starting.

Accordingly, implementation of the present invention also involves in-use unambiguously determining, during a current or instantaneous engine starting, the extent to which the charging system or mechanism functioned, or malfunctioned, during the previous operation or use of the combustion engine. Monitoring (detecting, measuring, and analyzing) the extent to which the battery is recharged by the charging system or mechanism is performed in terms of magnitude of voltage supplied by the charging system or mechanism (via an alternator or generator) to the battery during operation or use of the combustion engine.

For each of the first and second preferred embodiments 100 (FIG. 3) and 200 (FIG. 4), respectively, according to results of steps and operations performed and completed in parallel and/or in series, via operative connection and combined operation of first, second, and third multi-functional modules (10', 102, and 104, respectively, in first preferred embodiment 100; 15', 102, and 104, respectively, in second preferred embodiment 200) with logic function linking group 112, involving various logic operations and decisions, there is in-use unambiguously determining the single logically correct specific case, from a plurality of different logically correct specific cases, associated with the combustion engine battery in, or not in, the near-end-of-life (NEOL) state. Logic function linking group 112 performs logic operations and makes decisions using outputs of the first, second, and third multi-functional modules, for determining the single logically correct specific case, from the plurality of different logically correct specific cases, associated with the combustion engine battery in, or not in, the near-end-of-life (NEOL) state, during each engine starting.

An indicating mechanism 114, operatively connected to logic function linking group 112, is activated for indicating the single logically correct specific case, from the plurality of different logically correct specific cases, associated with the combustion engine battery in, or not in, the near-end-of-life (NEOL) state, for each engine starting.

Implementation of each of the first and second preferred embodiments of the method and device of the present invention are herein further described in detail. Reference is again made to FIGS. 3 and 4, schematic flow and block diagrams illustrating the first and second preferred embodiments 100 and 200, respectively, of the method and device of the present invention, featuring operative parallel connection, and multi-level combined operation, of three (electronic/software) multi-functional modules (each indicated in FIGS. 3 and 4 by a dashed dark line enclosure): first multi-functional module (10' in first preferred embodiment 100; 15' in second preferred embodiment 200), second multi-functional module 102, and third multi-functional module 104, with a logic function linking group 112, and with an indicating mechanism 114. Each of the first and second preferred embodiments 100 and 200, respectively, is constructed and operative for in-use detecting low cranking strength of a combustion engine battery during engine starting, and for in-use unambiguously determining, and indicating, the near-end-of-life (NEOL) state of a combustion engine battery.

Each of the first and second preferred embodiments 100 (FIG. 3) and 200 (FIG. 4), respectively, features the following operatively connected primary components: (a) a first multi-functional module (10' in first preferred embodiment 100; 15' in second preferred embodiment 200), (b) a second multi-functional module 102, (c) a third multi-functional module 104, (d) a logic function linking group 112 (indicated in each figure by the group of 'AND', 'OR', and 'NOT' conventionally known and used terms and symbols shown outside of the dashed dark line enclosed first, second, and third, multi-functional modules), and (e) an indicating mechanism 114.

Each of the first and second preferred embodiments 100 (FIG. 3) and 200 (FIG. 4), respectively, also includes a plurality of multi-functional module input/output signal paths (indicated by lines between components) and junctions (indicated by filled in circles along input/output signal path lines), whose structure and function are compatible with structure and function of the means (that is, electronic, software, integrated combination of electronic and software) used for operating first, second, and third, multi-functional modules (10' in first preferred embodiment 100; 15' in second preferred embodiment 200), 102, and 104, respectively, as well as with the means used for operating logic function linking group 112, and indicating mechanism 114.

In a manner similar to different initial implementation of the hereinabove briefly illustratively described specific form of each generalized first and second preferred embodiment 10 and 15 (FIGS. 1 and 2, respectively) of the 'parent' invention (PCT International Patent Application No. US01/25596), implementation of the first preferred embodiment 100 (FIG. 3) of the present invention is initiated by integrating 'logic' values generated by a comparator 14 which compares and assigns logic values to changes in battery voltage (BV) relative to the value (RV1) of a first constant reference voltage 12, for forming an output signal of a first integrator 16, which is sent to a first detector 18, during each engine starting, whereas, implementation of the second preferred embodiment 200 (FIG. 4) of the present invention is initiated by integrating 'analog' values of changes in battery voltage (BV) relative to the value (RV1) of first constant reference voltage 12 (without first comparing the voltage changes by a comparator), for forming an output signal of first integrator 16, which is sent to first detector 18, during each engine starting.

Different initial implementation of each of the first and second preferred embodiments 100 (FIG. 3) and 200 (FIG. 4), respectively, of the present invention is clearly illustratively described below in sub-steps (i)–(iii) of Step (a) of each preferred embodiment, along with reference to the following illustrative description of the components of first multi-functional module (10' in first preferred embodiment 100; 15' in second preferred embodiment 200) of each preferred embodiment.

Thus, in first preferred embodiment 100 (FIG. 3), first multi-functional module 10' features the following operatively connected components: (i) a first reference constant DC voltage 12, having a first reference voltage value, RV1, (ii) a comparator 14, (iii) a first integrator 16, (iv) a first detector 18, and (v) a counter reset sub-module 70, including components: (1) a first one shot 72, (2) a first counter 74, (3) a first counter reset mechanism 75 operatively associated with first counter 74, (4) a reset signal detector 76, (5) a first reset delay 78, and (6) a reset logic sub-module 80. First multi-functional module 10' also includes compatibly structured and functioning input/output signal paths and junctions.

In second preferred embodiment 200 (FIG. 4), first multi-functional module 15' features the following operatively connected components (without comparator 14): (i) a first reference constant DC voltage 12, having a first reference voltage value, RV1, (ii) a first integrator 16, (iii) a first detector 18, and (iv) a counter reset sub-module 70, including components: (1) a first one shot 72, (2) a first counter 74, (3) a first counter reset mechanism 75 operatively associated with first counter 74, (4) a reset signal detector 76, (5) a first reset delay 78, and (6) a reset logic sub-module 80. First multi-functional module 15' also includes compatibly structured and functioning input/output signal paths and junctions.

In each of the first and second preferred embodiments 100 (FIG. 3) and 200 (FIG. 4), respectively, second multi-functional module 102 features the following operatively connected components: (i) a second reference constant. DC voltage 134, having a second reference voltage value, RV2, (ii) a second integrator 136, (iii) a second detector 138, and (iv) a second counter 140. Second multi-functional module 102 also includes compatibly structured and functioning input/output signal paths and junctions.

In each of the first and second preferred embodiments 100 (FIG. 3) and 200 (FIG. 4), respectively, third multi-functional module 104 features the following operatively connected components: (i) a third detector 142, (ii) a second reset delay 144, (iii) a third reference constant DC voltage 146, having a third reference voltage value, RV3, (iv) a third integrator 148, (v) a fourth detector 150, (vi) a second one shot 152, (vii) a flip-flop 154, and (viii) a first 'AND' logic element 156. Third multi-functional module 104 also includes compatibly structured and functioning input/output signal paths and junctions.

In each of the first and second preferred embodiments 100 (FIG. 3) and 200 (FIG. 4), respectively, logic function linking group 112 features the following operatively connected logic elements (indicated by the plurality of 'AND', 'OR', and 'NOT' conventionally known and used terms and symbols shown 'outside' of the dashed dark line enclosed multi-functional modules): (i) a second 'AND' logic element 158, (ii) a third 'AND' logic element 160, (iii) a fourth 'AND' logic element 162, (iv) a fifth 'AND' logic element 164, (v) an 'OR' logic element 166, (vi) a first 'NOT' logic element 168, and (vii) a second 'NOT' logic element 170. Logic function linking group 112 also includes compatibly structured and functioning input/output signal paths and junctions.

In each of the first and second preferred embodiments 100 (FIG. 3) and 200 (FIG. 4), respectively, indicating mechanism 114 includes (i) a first indicator 114a, (ii) a second indicator 114b, and (iii) a third indicator 114c, which are operatively connected to appropriate logic elements of logic function linking group 112.

In Step (a) for implementing each of the first and second preferred embodiments 100 (FIG. 3) and 200 (FIG. 4), respectively, of the present invention, there is counting a first number of occurrences of low cranking strength exhibited by the battery, for a plurality of engine startings, via operative connection of first multi-functional module (10' in first preferred embodiment 100; 15' in second preferred embodiment 200), operating with a first set of low cranking strength criteria, to logic function linking group 112, where the first set of low cranking strength criteria is based on using the value (RV1) of first reference voltage 12.

As previously stated above, implementation of the first preferred embodiment 100 (FIG. 3) of the present invention is initiated by integrating 'logic' values generated by comparator 14 which compares and assigns logic values to changes in battery voltage (BV) relative to the value (RV1) of first constant reference voltage 12, for forming an output signal of first integrator 16, which is sent to first detector 18, during each engine starting. Thus, Step (a) of the first preferred embodiment 100 (FIG. 3) of the present invention is initiated according to the following sub-steps (i) through (iii), along with reference to the previous illustrative description, above, of the components of first multi-functional module 10' in first preferred embodiment 100.

In sub-step (i) of Step (a), of the first preferred embodiment 100 (FIG. 3), there is sensing the time varying voltage of the combustion engine battery by comparator 14, via first multi-functional module 10', from initiation of, and during, each engine starting, including, during initial cranking of the engine crankshaft.

Sensing the time varying voltage of the combustion engine battery by comparator 14 is initiated as a result of an operator turning an ignition key or depressing an ignition button of the vehicle or device for activating the starter mechanism and initiating cranking of the motor crankshaft.

Comparator 14 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, hereinafter also referred to as battery voltage (BV), is continuously or discontinuously sensed by comparator 14 from initiation of, and during, engine starting.

In sub-step (ii) of Step (a), of the first preferred embodiment 100 (FIG. 3), there is comparing the time varying battery voltage (BV) to the value (RV1) of first reference constant DC voltage 12 by comparator 14, via first multi-functional module 10', for forming a plurality of output signals of comparator 14, from initiation of, and during, each engine starting.

The value (RV1) of first reference constant DC voltage 12, hereinafter referred to as the value (RV1) of first reference voltage 12, is preferably set prior to or at the time of installation of first preferred embodiment 100 in the combustion engine, and is sent, via junction 22, to comparator 14. First reference voltage 12 is set at a value (RV1) corresponding to less than normal, but sufficient, cranking strength of the battery required for activating and initiating turning of the crankshaft during engine starting, according to specifications, characteristics, and operating behavior, of the starter mechanism of the particular combustion engine and/ or according to requirements of the particular application of the vehicle or device powered by the combustion engine.

Comparator 14 provides a digital, preferably, logic value, '0' or '1', output signal via junction 24. In particular, for battery voltage (BV) larger than the value (RV1) of first reference voltage 12, such that (BV−RV1) is positive, comparator output signal is assigned the value '0', a likely, but not definitive, indication of normal cranking strength of the battery. In contrast, for battery voltage (BV) equal to or less than the value (RV1) of first reference voltage 12, such that (BV−RV1) becomes zero or negative, respectively, comparator output signal is assigned the value '1', a likely, but not definitive, indication of low, also referred to as less than normal, cranking strength of the battery.

Prior to activation and initial turning of the crankshaft and engine starting, the electromechanical starting load of the starter mechanism is relatively low, such that (BV−RV1) is normally positive, resulting in a comparator output signal of '0'. During and immediately following activation and initial turning of the crankshaft via the cranking strength of the battery, in the relatively short initial time interval of engine starting, typically of the order of one second, the electromechanical load significantly increases, along with a corresponding significant and sharp drop in battery voltage, such that (BV−RV1) normally decreases sharply with time, possibly even being negative, at least until the time when the charging system or mechanism (generator or alternator) of the combustion engine starts operating for charging the battery.

Hereinafter, two generally applicable scenarios of battery behavior are described with respect to implementation and operation of Step (a) of in-use automatically monitoring (detecting, measuring, and analyzing) the starting history of the combustion engine.

In scenario (1), where the battery exhibits normal cranking strength during engine starting, following the initial time interval of engine starting during which (BV–RV1) may normally become negative due to the starting load, (BV–RV1) is normally positive, such that the comparator output signal is normally '0'. However, during the complete, not just initial, time interval of engine starting, normally occurring random and/or periodic electromechanical noise and vibrations associated with the engine starting, cause random and/or periodic spikes or variations in the battery voltage (BV) resulting in random and/or periodic changes in (BV–RV1), including occurrences of (BV–RV1) being equal to zero or negative, whereby the comparator output signal changes to '1' (erroneously representing preliminary indication of low, or less than normal, cranking strength of the battery), immediately followed by changing back to '0' following the end of each such voltage spike or variation.

In scenario (2), where the battery exhibits low, or less than normal, cranking strength during engine starting, following the initial time interval of engine starting during which (BV–RV1) may normally become negative due to the starting load, (BV–RV1) remains negative or may become zero, such that the comparator output signal changes from being initially '0' prior to engine starting, to '1'. However, during the complete, not just initial, time interval of engine starting, normally occurring random and/or periodic electromechanical noise and vibrations associated with the engine starting, cause random and/or periodic spikes or variations in the battery voltage (BV) resulting in random and/or periodic changes in (BV–RV1), including occurrences of (BV–RV1) being positive, whereby the comparator output signal changes to '0' (erroneously representing preliminary indication of normal cranking strength of the battery), immediately followed by changing back to '1' following the end of each such voltage spike or variation.

In each scenario (1) or (2), immediately following the complete time interval of engine starting, when the charging system or mechanism (generator or alternator) of the combustion engine starts operating for charging the battery, battery voltage (BV) normally increases until reaching a steady-state range, whereby (BV–RV1) normally remains positive, such that the comparator output signal remains '0', during continued operation of the engine.

In sub-step (iii) of Step (a), of the first preferred embodiment 100 (FIG. 3), there is integrating the output signal of comparator 14 by first integrator 16, via first multi-functional module 10', during each engine starting.

The output signal of comparator 14 is continuously or discontinuously sent, via junction 24, to first integrator 16. First integrator 16 integrates a stream or plurality of logic values, '0' and '1', corresponding to time changes in the comparator output signal. During the above described engine starting, (BV–RV1) can be positive, or, zero or negative, such that the comparator output signal changes between '0' and '1', respectively. Accordingly, integration of the comparator output signal results only in a non-negative value.

First integrator 16 takes into account, by integrating over, all the random and/or periodic spikes or variations in the battery voltage (BV) and therefore, all the random and/or periodic changes in (BV–RV1), including occurrences of (BV–RV1) being unexpectedly zero or negative, or positive, whereby comparator output signal unexpectedly changes to '1' or to '0', respectively, immediately followed by changing back to '0' or to '1', respectively, following the end of each voltage spike or variation, during engine starting. By including first integrator 16 in first multi-functional module 10' in first preferred embodiment 100, the potentially erroneous affects of voltage spikes or variations on accurately and reproducibly determining the condition of low cranking strength of the battery during engine starting are at least minimized, if not entirely eliminated.

As previously stated above, implementation of the second preferred embodiment 200 (FIG. 4) of the present invention is initiated by integrating 'analog' values of changes in battery voltage (BV) relative to the value (RV1) of first constant reference voltage 12 (without first comparing the voltage changes by a comparator), for forming an output signal of first integrator 16, which is sent to first detector 18, during each engine starting. Thus, Step (a) of the second preferred embodiment 200 (FIG. 4) of the present invention is initiated according to the following sub-steps (i) through (iii), along with reference to the previous illustrative description, above, of the components of first multi-functional module 15' in second preferred embodiment 200.

In sub-step (i) of Step (a), of the second preferred embodiment 200 (FIG. 4), there is sensing the time varying voltage of the battery by first integrator 16, via first multi-functional module 15', from initiation of, and during, each engine starting, including during initial cranking of the engine crankshaft.

Sensing the time varying voltage of the combustion engine battery by first integrator 16 is initiated as a result of an operator turning an ignition key or depressing an ignition button of the vehicle or device for activating the starter mechanism and initiating cranking of the motor crankshaft.

First integrator 16 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, (BV), is continuously or discontinuously sensed by first integrator 16 from initiation of, and during, engine starting.

In sub-step (ii) of Step (a), of the second preferred embodiment 200 (FIG. 4), there is evaluating the time varying difference between the time varying battery voltage (BV) and the value (RV1) of first reference voltage 12 by first integrator 16, via first multi-functional module 15', for forming a plurality of evaluated voltage differences, from initiation of, and during, each engine starting.

The value (RV1) of first reference voltage 12 is preferably set prior to or at the time of installation of device 15 in the combustion engine, and is continuously or discontinuously sent, via junction 23, to first integrator 16. First reference voltage 12 is set at a value (RV1) corresponding to less than normal, but, sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

For simplicity of, without limiting, describing the second preferred embodiment 200 of the present invention, without including a comparator in first multi-functional module 15', first integrator 16 evaluates the difference between the battery voltage (BV) and the value (RV1) of first reference voltage 12 in a form written as (RV1–BV), instead of as (BV−RV1) according to the previously described operation of first multi-functional module 10, including a comparator, in first preferred embodiment 100. Accordingly, for battery voltage (BV) larger than the value (RV1) of first reference voltage 12, evaluation of (RV1−BV) is negative, a likely, but not definitive, indication of normal cranking strength of the battery. In contrast, for battery voltage (BV) equal to or less than the value (RV1) of first reference voltage 12, evaluation of (RV1−BV) becomes equal to zero or positive, respectively, a likely, but not definitive, indication of low, or less than normal, cranking strength of the battery.

Prior to activation and initial turning of the crankshaft and engine starting, the electromechanical starting load of the starter mechanism is relatively low, such that (RV1−BV) is normally negative. During and immediately following activation and initial turning of the crankshaft via the cranking strength of the battery, in the relatively short initial time interval of engine starting, typically of the order of one second, the electromechanical load significantly increases, along with a corresponding significant and sharp drop in battery voltage, such that (RV1−BV) normally becomes positive with time, at least until the time when the engine generator or alternator starts operating for charging the battery. As for implementation and operation of first multi-functional module 10' of first preferred embodiment 100 described above, two generally applicable scenarios of battery behavior are described herein following with respect to implementation and operation of second multi-functional module 15' of second preferred embodiment 200.

In scenario (1), where the battery exhibits normal cranking strength during engine starting, following the initial time interval of engine starting during which (RV1−BV) normally becomes positive due to the starting load, (RV1−BV) is normally negative. However, during the complete, not just initial, time interval of engine starting, normally occurring random and/or periodic electromechanical noise and vibrations associated with the engine starting, cause random and/or periodic spikes or variations in the battery voltage (BV), resulting in random and/or periodic changes in (RV1−BV), including occurrences of (RV1−BV) becoming equal to zero or positive, erroneously representing preliminary indication of low, or less than normal, cranking strength of the battery, immediately followed by changing back to being negative following the end of each such voltage spike or variation.

In scenario (2), where the battery exhibits low, or less than normal, cranking strength during engine starting, following the initial time interval of engine starting during which (RV1−BV) is normally positive due to the starting load, (RV1−BV) remains positive or may become zero. However, during the complete, not just initial, time interval of engine starting, normally occurring random and/or periodic electromechanical noise and vibrations associated with the engine starting, cause random and/or periodic spikes or variations in the battery voltage (BV), resulting in random and/or periodic changes in (RV1−BV), including occurrences of (RV1−BV) being negative, erroneously representing preliminary indication of normal cranking strength of the battery, immediately followed by changing back to being positive or zero following the end of each such voltage spike or variation.

In each scenario (1) or (2), immediately following the complete time interval of engine starting, when the engine generator or alternator starts operating for charging the battery, battery voltage (BV) normally increases until reaching a steady-state range, whereby (RV1−BV) normally remains negative during continued operation of the engine.

In sub-step (iii) of Step (a), of the second preferred embodiment 200 (FIG. 4), there is integrating the evaluated differences between the battery voltage (BV) and the value (RV1) of first reference voltage 12 by first integrator 16, via first multi-functional module 15', during each engine starting.

First integrator 16 continuously or discontinuously integrates a stream or plurality of analog or digital values of (RV1−BV) varying in time. During the above described engine starting, the majority of the plurality of values of (RV1−BV) generated according to scenario (1) or (2) is either negative, or, positive or zero. Accordingly, the output signal of first integrator 16 is a negative, or, positive or zero, respectively, analog or digital value.

First integrator 16 takes into account, by integrating over, all the random and/or periodic spikes or variations in the battery voltage (BV), and therefore, all the random and/or periodic changes in (RV1−BV), including occurrences of (RV1−BV) being unexpectedly zero or positive, or, negative, according to scenario (1) or (2), respectively, immediately followed by changing back to being negative, or, positive or zero, respectively, following the end of each voltage spike or variation, during engine starting. By including first integrator 16 in first multi-functional module 15' in second preferred embodiment 200, the potentially erroneous affects of voltage spikes or variations on accurately and reproducibly determining the condition of low cranking strength of the battery during engine starting are at least minimized, if not entirely eliminated.

After completing preceding sub-step (iii), implementation of each of the first and second preferred embodiments 100 (FIG. 3) and 200 (FIG. 4), respectively, is continued with immediately following sub-step (iv).

In sub-step (iv) of Step (a), of each of the first and second preferred embodiments 100 (FIG. 3) and 200 (FIG. 4), respectively, there is determining and responding to the output signal of first integrator 16 by first detector 18, via first multi-functional module (10' in first preferred embodiment 100; 15' in second preferred embodiment 200), during each engine starting.

The output signal of first integrator 16 is continuously or discontinuously sent, via junction 26, to first detector 18. First detector 18 determines if the value of the first integrator output signal is less than, or, equal to or greater than, a pre-determined value of first detector 18, hereinafter, also referred to as PDV-D1. According to the result of this decision making step, the responsive output signal of first detector 18 is a digital, preferably, logic value, '0' or '1', respectively.

Pre-determined value (PDV-D1) of first detector 18, is preferably, but not limited to being, set at a positive value, representing a larger than normal decrease in battery voltage during engine starting, corresponding to less than normal, but, still sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

In scenario (1), for the first preferred embodiment 100 (FIG. 3), where the battery exhibits normal cranking strength during engine starting, (BV−RV1) is usually positive (however, as previously described above in sub-step (ii), there are negative contributions of (BV−RV1) due to normally occurring random and/or periodic electromechanical noise and vibrations associated with the engine starting, causing random and/or periodic negative spikes or variations in the battery voltage (BV)), such that comparator output signal is usually '0', translating to a first integrator output signal equal to zero, or, positive and close to zero. Thus, in this scenario, the first integrator output signal is less than the pre-determined value (PDV-D1), whereby the output signal of first detector 18 is assigned the value '0'.

In scenario (1), for the second preferred embodiment 200 (FIG. 4), where the battery exhibits normal cranking strength during engine starting, (RV1–BV) is usually negative (however, as described above in sub-step (ii), there are positive contributions of (RV1–BV) due to normally occurring random and/or periodic electromechanical noise and vibrations associated with the engine starting, causing random and/or periodic negative spikes or variations in the battery voltage (BV)), translating to a first integrator output signal being negative. Thus, in this scenario, the first integrator output signal is less than the pre-determined value (PDV-D1), whereby the output signal of first detector 18 is assigned the value '0'.

In scenario (2), for the first preferred embodiment 100 (FIG. 3), where the battery exhibits low, or less than normal, cranking strength during engine starting, (BV–RV1) is usually negative (however, as previously described above in sub-step (ii), there are positive contributions of (BV–RV1) due to normally occurring random and/or periodic electromechanical noise and vibrations associated with the engine starting, causing random and/or periodic positive spikes or variations in the battery voltage (BV)), such that comparator output signal is usually '1', translating to a first integrator output signal greater than one, with time. Thus, in this scenario, the first integrator output signal is equal to or greater than the predetermined value (PDV-D1), whereby the output signal of first detector 18 is assigned the value '1'.

In scenario (2), for the second preferred embodiment 200 (FIG. 4), where the battery exhibits low, or less than normal, cranking strength during engine starting, (RV1–BV) is usually positive or zero (however, as described above in sub-step (ii), there are negative contributions of (RV1–BV) due to normally occurring random and/or periodic electromechanical noise and vibrations associated with the engine starting, causing random and/or periodic positive spikes or variations in the battery voltage (BV)), translating to a first integrator output signal being positive or zero. Thus, in this scenario, the first integrator output signal is equal to or greater than the pre-determined value (PDV-D1), whereby the output signal of first detector 18 is assigned the value '1'.

In scenario (2), during Step (a), of each of the first and second preferred embodiments 100 (FIG. 3) and 200 (FIG. 4), respectively, the first integrator output signal being equal to or greater than the pre-determined value (PDV-D1) of first detector 18 corresponds to the 'first' condition or criterion of the two conditions or criteria in the 'first' set of low cranking strength conditions or criteria, of the present invention. This first set of low cranking strength conditions or criteria is based on using the value (RV1) of first reference voltage 12, according to previous sub-steps (ii)–(iii) of Step (a), via first multi-functional module (10' in first preferred embodiment 100; 15' in second preferred embodiment 200), as part of performing Step (a), for counting a first number of occurrences of low cranking strength exhibited by the battery, for a plurality of engine startings.

In sub-step (v) of Step (a), of each of the first and second preferred embodiments 100 (FIG. 3) and 200 (FIG. 4), respectively, there is determining and responding to a change in the output signal of first detector 18 by first one shot 72, via first multi-functional module (10' in first preferred embodiment 100; 15' in second preferred embodiment 200), during each engine starting.

First one shot 72, being a commonly known 'mono-stable' electronic component, normally provides a single or mono-stable digital output signal, preferably, a logic value, '0' or '1'. The output signal of first detector 18 is continuously or discontinuously sent, via junction 28, to first one shot 72. During engine starting, first one shot 72 determines if there is a change in the output signal of first detector 18, for example, from '0' to '1', and responds accordingly by changing the output signal of first one shot 72, for example, from '0' to '1', respectively, for an 'unstable', or pre-determined, time interval, hereinafter referred to as T[first one shot].

In scenario (1), where the battery exhibits normal cranking strength during engine starting, the output signal of first detector 18 is '0', whereby first one shot 72 responds by remaining in its mono-stable state with an output signal of '0'.

In scenario (2), where the battery exhibits low, or less than normal, cranking strength during engine starting, the output signal of first detector 18 changes from '0' to '1', whereby first one shot 72 determines this change, and responds accordingly by changing the output signal of first one shot 72 from '0' to '1', for the duration of the pre-determined time interval, T[first one shot], even if during T[first one shot] the output signal of first detector 18 changes back from '1' to '0'.

In sub-step (vi) of Step (a), of each of the first and second preferred embodiments 100 (FIG. 3) and 200 (FIG. 4), respectively, there is determining and responding to the output signal of first one shot 72 by first counter 74, via first multi-functional module (10' in first preferred embodiment 100; 15' in second preferred embodiment 200), during each engine starting.

The output signal of first one shot 72 is continuously or discontinuously sent, via junction 82, to first counter 74. First counter 74 is for maintaining a cumulative or incremental count number of each occurrence first multi-functional module (10' in first preferred embodiment 100; 15' in second preferred embodiment 200) determines that the battery exhibits low, or less than normal, cranking strength during engine starting. An internal mechanism (not shown) of first counter 74 counts the number of occurrences of low cranking strength of the battery, for example, 0, 1, 2, 3, 4, 5, . . . , and provides a digital, preferably, logic value, '0' or '1', output signal to logic function linking group 112.

When first counter 74 registers or determines a count number of occurrences of low, or less than normal, cranking strength of the battery, equal to or greater than a pre-determined count number, hereinafter, also referred to as PDCN-C1, for example, 0, or, 1, or, 2, or, 3, or, 4, or, 5, first counter 74 sends an appropriate output signal, via first multi-functional module output 116, to logic function linking group 112, for input into the various logic operations and decisions performed by logic function linking group 112.

In scenario (1), where the battery exhibits normal cranking strength during engine starting, first detector 18 determines the value of the output signal of first integrator 16 to be less than the pre-determined value (PDV-D1) of first detector 18, such the output signal of first detector 18 is '0', and the output signal of first one shot 72 remains at '0', according to scenario (1), described above in sub-steps (iv)–(v). Accordingly, first counter 74 responds by not incrementing its current count number of occurrences of low cranking strength of the battery, continuing to register a count number of occurrences of low, or less than normal, cranking strength of the battery less than PDCN-C1, and provides an output signal of '0', via first multi-module output 116, to logic function linking group 112, for input into the various logic operations and decisions performed by logic function linking group 112.

In scenario (2), where the battery exhibits low, or less than normal, cranking strength during engine starting, first detector 18 determines the value of the output signal of integrator 16 to be equal to or greater than the pre-determined value (PDV-D1) of first detector 18, such that the output signal of first detector 18 changes from '0' to '1', and the output signal of first one shot 72 changes from '0' to '1' for the pre-determined time interval, T[first one shot], according to scenario (2), described above in sub-steps (iv)–(v). Accordingly, first counter 74 responds by incrementing its count number of occurrences of low cranking strength of the battery. When first counter 74 registers a count number equal to or greater than PDCN-C1, first counter 74 sends an output signal of '1', via first multi-functional module output 116, to logic function linking group 112, for input into the various logic operations and decisions performed by logic function linking group 112.

In scenario (2), during Step (a), of each of the first and second preferred embodiments 100 (FIG. 3) and 200 (FIG. 4), respectively, first counter 74 registering a count number equal to or greater than the pre-determined count number (PDCN-C1) of first counter 74 corresponds to the 'second' condition or criterion of the two conditions or criteria in the 'first' set of low cranking strength conditions or criteria, of the present invention. As previously stated, this first set of low cranking strength conditions or criteria is based on using the value (RV1) of first reference voltage 12, according to previous sub-steps (ii)–(iii) of Step (a), via first multi-functional module (10' in first preferred embodiment 100; 15' in second preferred embodiment 200), as part of performing Step (a), for counting a first number of occurrences of low cranking strength exhibited by the battery, for a plurality of engine startings.

In scenario (2), the output signal of first one shot 72 remains at '1' for the pre-determined time interval, T[first one shot], in order to prevent activation of first counter reset mechanism 75 associated with first counter 74, for resetting first counter 74, according to the appropriate output signal sent by reset logic sub-module 80, as described below in sub-steps (vii)–(ix).

In sub-step (vii) of Step (a), of each of the first and second preferred embodiments 100 (FIG. 3) and 200 (FIG. 4), respectively, there is determining and responding to the output signal of first integrator 16 by reset signal detector 76, during each engine starting, substantially simultaneous to above described sub-step (iv) of determining and responding to the output signal of first integrator 16 by first detector 18, via first multi-functional module (10' in first preferred embodiment 100; 15' in second preferred embodiment 200), during each engine starting.

The output signal of first integrator 16 is continuously or discontinuously sent, via junction 26, along signal path 90, to reset signal detector 76. Reset signal detector 76 determines if the output signal of first integrator 16 is less than, or, equal to or greater than, a pre-determined value of reset signal detector 76, hereinafter, also referred to as PDV-RS. According to the result of this decision making step, the responsive output signal of reset signal detector 76 is a digital, preferably, logic value, '0' or '1', respectively.

Pre-determined value (PDV-RS) of reset signal detector 76, is set at a value representing a normally occurring large decrease in battery voltage during engine starting. Such normally occurring large decrease in battery voltage during engine starting corresponds to normal cranking strength of the battery required for activating and initiating turning of the crankshaft during engine starting, according to specifications, characteristics, and operating behavior, of the starter system or mechanism of the particular combustion engine and/or according to requirements of the particular application of the vehicle or device powered by the combustion engine. The magnitude of PDV-RS of reset signal detector 76 is set less than the magnitude of the pre-determined value (PDV-D1) of first detector 18, since, as previously described above in sub-step (iv), pre-determined value (PDV-D1) of first detector 18, is set at a value representing a larger than normal decrease in battery voltage during engine starting, corresponding to less than normal, but, still sufficient, cranking strength of the battery required for activating and initiating turning of the crankshaft during engine starting.

Accordingly, the responsive output signal of reset signal detector 76 changes from '0' to '1' during each scenario of engine starting, including scenario (1) where the battery exhibits normal cranking strength during engine starting, or, scenario (2) where the battery exhibits low, or less than normal, cranking strength during engine starting. As such, reset signal detector 76 serves as an engine starting detector or indicator, activating upon any significant decrease in battery voltage corresponding to engine starting, in general, and to activation and initiation of cranking of the crankshaft, in particular.

In sub-step (viii) of Step (a), of each of the first and second preferred embodiments 100 (FIG. 3) and 200 (FIG. 4), respectively, there is delaying the forwarding of the output signal of reset signal detector 76 by first reset delay 78, via first multi-functional module (10' in first preferred embodiment 100; 15' in second preferred embodiment 200), during each engine starting.

The output signal of reset signal detector 76 is continuously or discontinuously sent, via junction 86, to first reset delay 78. In scenario (2), during the time interval of engine starting with low cranking strength of the battery, as a consequence of PDV-RS of reset signal detector 76 being set less than PDV-D1 of first detector 18, the output signal of reset signal detector 76 changes in time from '0' to '1' before the output signal of first detector 18 changes from '0' to '1'.

In the present invention, by including counter reset sub-module 70, the function of including first reset delay 78 is for delaying the forwarding of the output signal of reset signal detector 76, for a pre-determined time interval, hereinafter, also referred to as T[first reset delay], until first integrator 16 completes its function according to above described sub-step (iii) of integrating the output signal of comparator 14 during engine starting (in accordance with operation of first multi-functional module 10 of first preferred embodiment 100) or of integrating the evaluated differences between the battery voltage (BV) and the value (RV1) of first reference voltage 12, during engine starting (in accordance with operation of first multi-functional module 15' of second preferred embodiment 200), and also until first one shot 72 completes its function according to above described sub-step (v) of determining and responding to a change in the output signal of first detector 18 during engine starting. The pre-determined time interval, T[first reset delay], of first reset delay 78, is typically set at a value, for example, a fraction of a second, which is significantly less than the value, for example, one second, of the predetermined time interval, T[first one shot], of first one shot 72, for properly enabling completion of sub-step (iii) through sub-step (v).

In sub-step (ix) of Step (a), of each of the first and second preferred embodiments 100 (FIG. 3) and 200 (FIG. 4), respectively, there is analyzing and responding to the substantially simultaneous reception of the output signal of first one shot 72 and the output signal of first reset delay 78, by reset logic sub-module 80, via first multi-functional module (10' in first preferred embodiment 100; 15' in second preferred embodiment 200), during each engine starting.

The output signal of first one shot 72 is continuously or discontinuously sent, via junction 82, along signal path 92, to reset logic sub-module 80, while the output signal of first reset delay 78 is continuously or discontinuously sent, via junction 88, to reset logic sub-module 80. Reset logic sub-module 80 performs a logic operation on the values of these input signals, and determines if there is to be a resetting of first counter 74. According to the result of this decision making step, the responsive output signal of reset logic sub-module 80 is a digital, preferably, logic value, '1' or '0', according to scenario (1) where the battery exhibits normal cranking strength during engine starting, or, scenario (2) where the battery exhibits low, or less than normal, cranking strength during engine starting, respectively.

Reset logic sub-module 80 operates according to three sub-steps, as follows:

In sub-step (1) of sub-step (ix), reset logic sub-module 80 inverts the received output signal of first one shot 72, for example, digital logic value '0' or '1', for forming an inverted output signal of first one shot 72, for example, digital logic value '1' or '0', respectively, according to above described scenario (1), or, scenario (2), respectively.

In sub-step (2) of sub-step (ix), reset logic sub-module 80 performs an 'AND' logic operation on both the value of the inverted output signal of first one shot 72, '1' or '0', of sub-step (1), and on the value of the output signal of first reset delay 78, '1'. As described above in sub-step (vii), the output signal of reset signal detector 76 always changes from '0' to '1' during each above described scenario (1) or (2) of engine starting, whereby during engine starting, the value of the output signal of reset delay 78 always changes from '0' to '1'. Accordingly, the result of the 'AND' logic operation is either '1' 'AND' '1', or, '0' 'AND' '1', according to above described scenario (1), or, scenario (2), respectively.

In sub-step (3) of sub-step (ix), reset logic sub-module 80 responds to the result of the 'AND' logic operation of sub-step (2), by sending a corresponding output signal, '1' or '0', according to above described scenario (1), or, scenario (2), respectively, via junction 94, to first counter 74.

In sub-step (x) of Step (a), of each of the first and second preferred embodiments 100 (FIG. 3) and 200 (FIG. 4), respectively, there is analyzing and responding to the output signal of reset logic sub-module 80 by first counter 74, via first multi-functional module (10' in first preferred embodiment 100; 15' in second preferred embodiment 200), during each engine starting.

The output signal of reset logic sub-module 80, '1' or '0', according to above described scenario (1), or, scenario (2), respectively, is continuously or discontinuously sent, via junction 94, to first counter 74, whereby first counter reset mechanism 75 associated with first counter 74 responds by either activating, or, remaining inactive, for resetting first counter 74, respectively.

In scenario (1), where the battery exhibits normal cranking strength during engine starting, first counter reset mechanism 75 associated with first counter 74 is activated for resetting first counter 74. Then, first counter 74 sends an output signal of '0' to logic function linking group 112, for input into the various logic operations and decisions performed by logic function linking group 112.

In scenario (2), where the battery exhibits low, or less than normal, cranking strength during engine starting, first counter reset mechanism 75 associated with first counter 74 remains inactive, and responds by not resetting the new count number of, for example, 5, to zero. Then, first counter 74 sends an output signal of '1' to logic function linking group 112, for input into the various logic operations and decisions performed by logic function linking group 112.

A summary of the sequence of events relating to operation of counter reset sub-module 70 and first counter 74, through completion of sub-step (x) of Step (a), via first multi-functional module (10' in first preferred embodiment 100; 15' in second preferred embodiment 200), in each of the first and second preferred embodiments 100 and 200, respectively, of the present invention is as follows:

In scenario (1), where the battery exhibits normal cranking strength during engine starting, the first integrator output signal is less than the pre-determined value (PDV-D1) of first detector 18, whereby the output signal of first detector 18 is '0', such that the output signal of first one shot 72 remains at '0', causing no incremental increase in the count number of first counter 74. First counter 74 determines that the count number, for example, 0, or, 1, or, 2, or, 3, or, 4, of occurrences of low cranking strength of the battery is less than the pre-determined count number (PDCN-C1) of first counter 74, for example, 5, while the output signal of reset signal detector 76 and of first reset delay 78 each change from '0' to '1'. Reset logic sub-module 80 inverts the received output signal of first one shot 72 from '0' to '1', and performs the 'AND' logic operation on these input signal values of '1' 'AND' '1', resulting in an output signal of '1' being sent to first counter 74, whereby counter reset mechanism 75 associated with first counter 74 responds by resetting the current count number of, for example, 0, or, 1, or, 2, or, 3, or, 4, to zero, followed by first counter 74 sending an output signal of '0' to logic function linking group 112, for input into the various logic operations and decisions performed by logic function linking group 112.

In scenario (2), where the battery exhibits low, or less than normal, cranking strength during engine starting, the first integrator output signal is equal to or greater than the pre-determined value (PDV-D1) of first detector 18, whereby the output signal of first detector 18 changes from '0' to '1', such that the output signal of first one shot 72 changes from '0' to '1', causing an incremental increase in the count number of first counter 74, for example, from 0 to 1, or, from 1 to 2, or, from 2 to 3, or, from 3 to 4, or, from 4 to 5. First counter 74 determines that the new count number, for example, 5, of occurrences of low cranking strength of the battery is equal to the pre-determined count number (PDCN-C1) of first counter 74, for example, 5, while the output signal of reset signal detector 76 and of first reset delay 78 each change from '0' to '1'. Reset logic sub-module 80 inverts the received output signal of first one shot 72 from '1' to '0', and performs the 'AND' logic operation on these input signal values of '0' 'AND' '1', resulting in an output signal of '0' being sent to first counter 74, whereby counter reset mechanism 75 associated with first counter 74 responds by not resetting the new count number of, for example, 5, to zero, followed by first counter 74 sending an output signal of '1' to logic function linking group 112, for input into the various logic operations and decisions performed by logic function linking group 112.

As described below, in Step (b) of each of the first and second preferred embodiments 100 (FIG. 3) and 200 (FIG. 4), respectively, there is performing sub-steps (i)–(v) via operation of second multi-functional module 102, substantially simultaneous to performing previously described sub-steps (i)–(x) of Step (a) via operation of first multi-functional module (10' in first preferred embodiment 100; 15' in second preferred embodiment 200).

Performing sub-steps (i)–(v) of Step (b), via operation of second multi-functional module 102, is similar to performing sub-steps (i)–(vi), of Step (a), via operation of first multi-functional module (10' in first preferred embodiment 100; 15' in second preferred embodiment 200). The main difference being that the value (RV2) of second reference voltage 134, used during operation of second multi-functional module 102, is different, preferably larger, than the value (RV1) of first reference voltage 12, used during operation of first multi-functional module (10' in first preferred embodiment 100; 15' in second preferred embodiment 200).

Operation of second multi-functional module 102 in Step (b) corresponds to implementing an additional, or a second, level of monitoring the starting history of the combustion engine, in general, and of the combustion engine battery, in particular, in terms of changes in battery voltages during engine starting as a function of the number of engine startings. Performing below described sub-steps (i)–(v) via operation of second multi-functional module 102, substantially simultaneous to performing previously described sub-steps (i)–(x) via operation of first multi-functional module (10' in first preferred embodiment 100; 15' in second preferred embodiment 200), corresponds to the previously stated first specific aspect of novelty and inventiveness of the present invention, whereby, during implementation there is in-use automatic multi-level monitoring (detecting, measuring, and analyzing) the cranking strength of the battery, during each engine starting, for a plurality of engine startings.

This specific monitoring is done by multi-level counting of the number of occurrences of low cranking strength exhibited by the battery, during each engine starting, for a plurality of engine startings, via operative parallel connection and substantially simultaneous operation of first multi-functional module (10' in first preferred embodiment 100; 15' in second preferred embodiment 200) operating with a first set of low cranking strength criteria and second multi-functional module 102 operating with a second set of low cranking strength criteria, with logic function linking group 112. The first set of low cranking strength criteria is based on using the value (RV1) of first reference voltage 12, while the second set of low cranking strength criteria is based on using the value (RV2) of second reference voltage 134, whereby the value (RV2) of second reference voltage 134 is different, preferably larger, than the value (RV1) of first reference voltage 12.

In Step (b) for implementing each of the first and second preferred embodiments 100 (FIG. 3) and 200 (FIG. 4), respectively, of the present invention, there is substantially simultaneous to Step (a), counting a second number of occurrences of low cranking strength exhibited by the battery, for the same plurality of engine startings of Step (a), via operative connection of second multi-functional module 104, operating with a second set of low cranking strength criteria, to logic function linking group 112. For performing Step (b), second multi-functional module 104 is operatively connected in parallel to first multi-functional module (10' in first preferred embodiment 100; 15' in second preferred embodiment 200), and the second set of low cranking strength criteria is based on using the value (RV2) of second reference voltage 134, whereby the value (RV2) of second reference voltage 134 is different from the value (RV1) of first reference voltage 12.

In sub-step (i) of Step (b), of each of the first and second preferred embodiments 100 (FIG. 3) and 200 (FIG. 4), respectively, there is sensing the time varying voltage of the battery by second integrator 136, via second multi-functional module 102, from initiation of, and during, each engine starting, including during the initial cranking of the engine crankshaft.

Substantially simultaneous to initiation of previously described sub-step (i) of Step (a), above, of each of the first and second preferred embodiments 100 (FIG. 3) and 200 (FIG. 4), respectively, sensing the time varying voltage of the battery by second integrator 136 is initiated as a result of the operator turning an ignition key or depressing an ignition button of the vehicle or device for activating the starter mechanism and initiating cranking of the motor crankshaft.

Second integrator 136 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, (BV), is continuously or discontinuously sensed by second integrator 136 from initiation of, and during, engine starting.

In sub-step (ii) of Step (b), of each of the first and second preferred embodiments 100 (FIG. 3) and 200 (FIG. 4), respectively, there is evaluating the time varying difference between the time varying battery voltage (BV) and the value (RV2) of second reference constant DC voltage 134 by second integrator 136, via second multi-functional module 102, for forming a plurality of evaluated voltage differences, from initiation of, and during, each engine starting.

The value (RV2) of second reference constant DC voltage 134, hereinafter referred to as the value (RV2) of second reference voltage 134, is preferably set prior to or at the time of installation of each of the first and second preferred embodiments 100 (FIG. 3) and 200 (FIG. 4), respectively, in the combustion engine, and is continuously or discontinuously sent, via junction 172, to second integrator 16. Second reference voltage 134 is set at a value (RV2) corresponding to less than normal, but, sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

During this additional, or second, level of implementing the present invention, second integrator 136 evaluates the difference between the battery voltage (BV) and the value (RV2) of second reference voltage 134 in a form written as (RV2–BV). Accordingly, for battery voltage (BV) larger than the value (RV2) of second reference voltage 134, evaluation of (RV2–BV) is negative, a likely, but not definitive, indication of normal cranking strength of the battery. In contrast, for battery voltage (BV) equal to or less than the value (RV2) of second reference voltage 134, evaluation of (RV2−BV) becomes equal to zero or positive, respectively, a likely, but not definitive, indication of low, or less than normal, cranking strength of the battery.

Prior to activation and initial turning of the crankshaft and engine starting, the electromechanical starting load of the starter mechanism is relatively low, such that (RV2−BV) is normally negative. During and immediately following activation and initial turning of the crankshaft via the cranking strength of the battery, in the relatively short initial time interval of engine starting, typically of the order of one second, the electromechanical load significantly increases, along with a corresponding significant and sharp drop in battery voltage, such that (RV2−BV) normally becomes positive with time, at least until the time when the engine generator or alternator starts operating for charging the battery.

In a manner similar to performance of previously described sub-step (ii) of Step (a), of each of the first and second preferred embodiments 100 (FIG. 3) and 200 (FIG. 4), respectively, during the 'first' level of monitoring the starting history of the combustion engine in terms of changes in battery voltages during engine starting as a function of the number of engine startings, via operation of first multi-functional module (10 in first preferred embodiment 100; 15' in second preferred embodiment 200), here, at this stage of implementing the present invention, in sub-step (ii) of Step (b), of each of the first and second preferred embodiments 100 (FIG. 3) and 200 (FIG. 4), respectively, during the 'second' level of monitoring the starting history of the combustion engine, two scenarios of battery behavior are generally applicable with respect to operation of second multi-functional module 102. The main difference being that the value (RV2) of second reference voltage 134, used during operation of second multi-functional module 102, is larger than the value (RV1) of first reference voltage 12, used during operation of first multi-functional module (10' in first preferred embodiment 100; 15' in second preferred embodiment 200).

In scenario (1), where the battery exhibits normal cranking strength during engine starting, following the initial time interval of engine starting during which (RV2−BV) normally becomes positive due to the starting load, (RV2−BV) is normally negative. However, during the complete, not just initial, time interval of engine starting, normally occurring random and/or periodic electromechanical noise and vibrations associated with the engine starting, cause random and/or periodic spikes or variations in the battery voltage (BV), resulting in random and/or periodic changes in (RV2−BV), including occurrences of (RV2−BV) becoming equal to zero or positive, erroneously representing preliminary indication of low, or less than normal, cranking strength of the battery, immediately followed by changing back to being negative following the end of each such voltage spike or variation.

In scenario (2), where the battery exhibits low, or less than normal, cranking strength during engine starting, following the initial time interval of engine starting during which (RV2−BV) is normally positive due to the starting load, (RV2−BV) remains positive or may become zero. However, during the complete, not just initial, time interval of engine starting, normally occurring random and/or periodic electromechanical noise and vibrations associated with the engine starting, cause random and/or periodic spikes or variations in the battery voltage (BV), resulting in random and/or periodic changes in (RV2−BV), including occurrences of (RV2−BV) being negative, erroneously representing preliminary indication of normal cranking strength of the battery, immediately followed by changing back to being positive or zero following the end of each such voltage spike or variation.

In each scenario (1) or (2), immediately following the complete time interval of engine starting, when the engine generator or alternator starts operating for charging the battery, battery voltage (BV) normally increases until reaching a steady-state range, whereby (RV2−BV) normally remains negative during continued operation of the engine.

In sub-step (iii) of Step (b), of each of the first and second preferred embodiments 100 (FIG. 3) and 200 (FIG. 4), respectively, there is integrating the evaluated differences between the battery voltage (BV) and the value (RV2) of second reference voltage 134 by second integrator 136, via second multi-functional module 102, during each engine starting.

Second integrator 136 continuously or discontinuously integrates a stream or plurality of analog or digital values of (RV2−BV) varying in time. During the above described engine starting, the majority of the plurality of values of (RV2−BV) generated according to scenario (1) or (2) is either negative, or, positive or zero. Accordingly, the output signal of second integrator 136 is a negative, or, positive or zero, respectively, analog or digital value.

Second integrator 16 takes into account, by integrating over, all the random and/or periodic spikes or variations in the battery voltage (BV), and therefore, all the random and/or periodic changes in (RV2−BV), including occurrences of (RV2−BV) being unexpectedly zero or positive, or, negative, according to scenario (1) or (2), respectively, immediately followed by changing back to being negative, or, positive or zero, respectively, following the end of each voltage spike or variation, during engine starting. By including second integrator 136 in second multi-functional module 102 in each of the first and second preferred embodiments 100 and 200, respectively, the potentially erroneous affects of voltage spikes or variations on accurately and reproducibly determining the condition of low cranking strength of the battery during engine starting are at least minimized, if not entirely eliminated.

In sub-step (iv) of Step (b), of each of the first and second preferred embodiments 100 (FIG. 3) and 200 (FIG. 4), respectively, there is determining and responding to the output signal of second integrator 136 by second detector 138, via second multi-functional module 102, during each engine starting.

The output signal of second integrator 136 is continuously or discontinuously sent, via junction 174, to second detector 138. Second detector 138 determines if the value of the integrator output signal is less than, or, equal to or greater than, a pre-determined value of second detector 138, hereinafter, also referred to as PDV-D2. According to the result of this decision making step, the responsive output signal of second detector 138 is a digital, preferably, logic value, '0' or '1', respectively.

Pre-determined value (PDV-D2) of second detector 138, is preferably, but not limited to being, set at a positive value, representing a larger than normal decrease in battery voltage during engine starting, corresponding to less than normal, but, still sufficient, cranking strength of the battery required for activating and initiating turning of the crankshaft during engine starting, according to specifications, characteristics, and operating behavior, of the starter mechanism of the particular combustion engine and/or according to requirements of the particular application of the vehicle or device powered by the combustion engine.

In scenario (1), where the battery exhibits normal cranking strength during engine starting, (RV2−BV) is usually negative (however, as described above in sub-step (ii) of Step (b), there are positive contributions of (RV2−BV) due to normally occurring random and/or periodic electromechanical noise and vibrations associated with the engine starting, causing random and/or periodic negative spikes or variations in the battery voltage (BV)), translating to a second integrator output signal being negative. Thus, in this scenario, the second integrator output signal is less than the pre-determined value (PDV-D2), whereby the output signal of second detector 138 is assigned the value '0'.

In scenario (2), where the battery exhibits low, or less than normal, cranking strength during engine starting, (RV2−BV) is usually positive or zero (however, as described above in sub-step (ii) of Step (b), there are negative contributions of (RV2−BV) due to normally occurring random and/or periodic electromechanical noise and vibrations associated with the engine starting, causing random and/or periodic positive spikes or variations in the battery voltage (BV)), translating to a second integrator output signal being positive or zero. Thus, in this scenario, the second integrator output signal is equal to or greater than the pre-determined value (PDV-D2), whereby the output signal of second detector 138 is assigned the value '1'.

In scenario (2), during Step (b), of each of the first and second preferred embodiments 100 (FIG. 3) and 200 (FIG. 4), respectively, the second integrator output signal being equal to or greater than the pre-determined value (PDV-D2) of second detector 138 corresponds to the 'first' condition or criterion of the two conditions or criteria in the 'second' set of low cranking strength conditions or criteria, of the present invention. This second set of low cranking strength conditions or criteria is based on using the value (RV2) of second reference voltage 134, according to previous sub-steps (ii)–(iii) of Step (b), via second multi-functional module 102, as part of performing Step (b), for counting a second number of occurrences of low cranking strength exhibited by the battery, for the same plurality of engine startings monitored according to Step (a).

In sub-step (v) of Step (b), of each of the first and second preferred embodiments 100 (FIG. 3) and 200 (FIG. 4), respectively, there is determining and responding to the output signal of second detector 138 by second counter 140, via second multi-functional module 102, during each engine starting.

The output signal of second detector 138 is continuously or discontinuously sent, via junction 176, to second counter 140. Second counter 140 is for maintaining a cumulative or incremental count number, hereinafter, also referred to and indicated in FIGS. 3 and 4 as (CN2), of each occurrence second multi-functional module 102 determines that the battery exhibits low, or less than normal, cranking strength during engine starting. An internal mechanism (not shown) of second counter 140 counts the number of occurrences of low cranking strength of the battery, for example, 0, 1, 2, 3, 4, 5, . . . , corresponding to count number (CN2), and provides a digital, preferably, logic value, '0' or '1', output signal, via second multi-functional module output 118, to logic function linking group 112, for input into the various logic operations and decisions performed by logic function linking group 112.

When second counter 140 registers or determines a count number (CN2) of occurrences of low, or less than normal, cranking strength of the battery, equal to or greater than a pre-determined count number, hereinafter, also referred to as PDCN-C2, for example, 0, or, 1, or, 2, or, 3, or, 4, or, 5, second counter 140 sends an output signal, via second multi-functional module output 118, to logic function linking group 112.

In scenario (1), where the battery exhibits normal cranking strength during engine starting, second detector 138 determines the value of the output signal of second integrator 136 to be less than the pre-determined value (PDV-D2) of second detector 138, such that the output signal of second detector 138 is '0'. Accordingly, second counter 140 responds by not incrementing its current count number (CN2) of occurrences of low cranking strength of the battery, and continues to register a count number (CN2) of occurrences of low, or less than normal, cranking strength of the battery less than PDCN-C2.

In scenario (2), where the battery exhibits low, or less than normal, cranking strength during engine starting, second detector 138 determines the value of the output signal of second integrator 136 to be equal to or greater than the pre-determined value (PDV-D2) of second detector 138, such that the output signal of second detector 138 changes from '0' to '1'. Accordingly, second counter 140 responds by incrementing its count number (CN2) of occurrences of low cranking strength of the battery. In scenario (2), second counter 140 sends an output signal, via second multi-functional module output 118, to logic function linking group 112, for input into the various logic operations and decisions performed by logic function linking group 112, according to one of the following two specific conditions or logic operations:

(A) If second counter 140 registers a count number (CN2) less than PDCN-C2, second counter 140 sends an output signal of '1', (indicated as 'No' in FIGS. 3 and 4) via second multi-functional module output 118-N, via junction 178, to logic function linking group 112.

(B) If second counter 140 registers a count number (CN2) equal to or greater than PDCN-C2, second counter 140 sends an output signal of '1', (indicated as 'Yes' in FIGS. 3 and 4), via second multi-functional module output 118-Y, via junction 180, to logic function linking group 112.

In scenario (2), during Step (b), of each of the first and second preferred embodiments 100 (FIG. 3) and 200 (FIG. 4), respectively, second counter 140 registering a count number (CN2) equal to or greater than the pre-determined count number (PDCN-C2) of second counter 140 corresponds to the 'second' condition or criterion of the two conditions or criteria in the 'second' set of low cranking strength conditions or criteria, of the present invention. As previously stated, this second set of low cranking strength conditions or criteria is based on using the value (RV2) of second reference voltage 134, according to previous sub-steps (ii)–(iii) of Step (b), via second multi-functional module 102, as part of performing Step (b), for counting a second number of occurrences of low cranking strength exhibited by the battery, for the same plurality of engine startings monitored according to Step (a).

In Step (c), of each of the first and second preferred embodiments 100 (FIG. 3) and 200 (FIG. 4), respectively, there is automatically monitoring (detecting, measuring, and analyzing), the extent (that is, sufficient extent or insufficient extent) to which the battery was recharged, in terms of voltage supplied, by the charging system of the combustion engine during the previous use or operation of the combustion engine, via additional operative parallel connection of third multi-functional module 104 to logic function linking group 112, operative with first and second multi-functional modules, 10' and 102, respectively, during each engine starting.

In sub-step (i) of Step (c), of each of the first and second preferred embodiments 100 (FIG. 3) and 200 (FIG. 4), respectively, there is determining and responding to the output signal of second integrator 136 by third detector 142, via third multi-functional module 104, during each engine starting.

The output signal of second integrator 136 is continuously or discontinuously sent, via junction 174, along signal path 182, to third detector 142. Sub-step (i) of Step (c) is performed substantially simultaneously to sub-step (iv) of Step (b), of each of the first and second preferred embodiments 100 (FIG. 3) and 200 (FIG. 4), respectively, whereby there is determining and responding to the output signal of second integrator 136 by second detector 138, via second multi-functional module 102, during each engine starting.

Third detector 142 determines if the value of the integrator output signal is less than, or, equal to or greater than, a pre-determined value of third detector 142, hereinafter, also referred to as PDV-D3. According to the result of this decision making step, the responsive output signal of third detector 142 is a digital, preferably, logic value, '0' or '1', respectively.

Pre-determined value (PDV-D3) of third detector 142, is preferably, but not limited to being, set at a positive value, representing a normally occurring large decrease in battery voltage during engine starting. Such normally occurring large decrease in battery voltage during engine starting, corresponds to normal cranking strength of the battery required for activating and initiating turning of the crankshaft during engine starting, according to specifications, characteristics, and operating behavior, of the starter system or mechanism of the particular combustion engine and/or according to requirements of the particular application of the vehicle or device powered by the combustion engine.

The function of sub-step (i) of Step (c) is for detecting each occurrence of starting the engine or engine starting, during either previously described scenario (1), whereby the battery exhibits normal cranking strength during engine starting, or, scenario (2), whereby the battery exhibits low, or less than normal, cranking strength during engine starting. The responsive output signal of third detector 142 changes from '0' to '1' during each scenario of engine starting, that is, during scenario (1) or scenario (2). As such, third detector 142 serves as an engine starting detector or indicator, activating upon any significant decrease in battery voltage corresponding to engine starting, in general, and to activation and initiation of cranking of the crankshaft, in particular.

In sub-step (ii) of Step (c), of each of the first and second preferred embodiments 100 (FIG. 3) and 200 (FIG. 4), respectively, there is analyzing and responding to the substantially simultaneous reception of the output signal of third detector 142 and the output signal of flip-flop 154, by first 'AND' logic element 156, via third multi-functional module 104, during each engine starting.

The output signal of third detector 142 is continuously or discontinuously sent, via junction 184, along signal path 186, to first 'AND' logic element 156, while the output signal of flip-flop 154 is continuously or discontinuously sent, via junction 188, to first 'AND' logic element 156. First 'AND' logic element 156 performs the 'AND' logic operation on the values of both of these input signals, that is, using both the value of the output signal of third detector 142, '0' or '1', of previous sub-step (i) of Step (c), and the value of the output signal of flip-flop 154, '0' or '1'.

As described in previous sub-step (i) of Step (c), the value of the output signal of third detector 142 always changes from '0' to '1' during each above described scenario (1) or (2) of engine starting. Accordingly, during engine starting, the result of the 'AND' logic operation is either '1' 'AND' '0', or, '1' 'AND' '1', according to the value of the output signal of third detector 142, always equal to '1', and the value of the output signal of flip-flop 154, equal to '0' or '1', respectively. According to the result of this decision making step, the responsive output signal of 'AND' logic element 156 is a digital, preferably, logic value, '0' or '1', which is sent, via third multi-functional module output 120, along signal path 190, to logic function linking group 112, for input into the various logic operations and decisions performed by logic function linking group 112.

In sub-step (iii) of Step (c), of each of the first and second preferred embodiments 100 (FIG. 3) and 200 (FIG. 4), respectively, there is delaying the forwarding of the output signal of third detector 142 to flip-flop 154 by second reset delay 144, via third multi-functional module 104, during each engine starting.

The output signal of third detector 142 is continuously or discontinuously sent, via junction 184, to second reset delay 144. The function of including second reset delay 144 is for delaying the forwarding of the output signal of third detector 142, for a pre-determined time interval, herein, also referred to as T[second reset delay], to flip-flop 154. Following this delay, the output signal of third detector 142 is sent to flip-flop 154, via junction 192, and causes resetting of flip-flop 154, for each engine starting.

In sub-step (iv) of Step (c), of each of the first and second preferred embodiments 100 (FIG. 3) and 200 (FIG. 4), respectively, there is sensing the time varying voltage of the battery by third integrator 148, via third multi-functional module 104, from initiation of, and during, each engine starting, including during the initial cranking of the engine crankshaft.

Third integrator 148 is connected to battery leads 30 and 32, forming a direct or indirect electromechanical connection to the circuitry of the overall vehicle electrical system, where such connection may be internal or external to the engine compartment, in general, and internal or external to the battery, in particular. Voltage across battery leads 30 and 32, (BV), is continuously or discontinuously sensed by third integrator 148 from initiation of, and during, engine starting.

In sub-step (v) of Step (c), of each of the first and second preferred embodiments 100 (FIG. 3) and 200 (FIG. 4), respectively, there is evaluating the time varying difference between the time varying battery voltage (BV) and the value (RV3) of third reference constant DC voltage 146 by third integrator 148, via third multi-functional module 104, for forming a plurality of evaluated voltage differences, from initiation of, and during, each engine starting.

The value (RV3) of third reference constant DC voltage 146, hereinafter referred to as the value (RV3) of third reference voltage 146, is preferably set prior to or at the time of installation of either the first or second preferred embodiments 100 (FIG. 3) and 200 (FIG. 4), respectively, in the combustion engine, and is continuously or discontinuously sent, via junction 194, to third integrator 148. Third reference voltage 146 is set at a value (RV3) corresponding to a minimal voltage supplied by the charging system or mechanism (generator or alternator) of the combustion engine which under normal conditions, automatically recharges the battery following engine starting.

During sub-step (v) of Step (c), third integrator 148 evaluates the difference between the battery voltage (BV) and the value (RV3) of third reference voltage 146 in a form written as (BV–RV3). Accordingly, for battery voltage (BV) larger than the value (RV3) of third reference voltage 146, evaluation of (BV–RV3) is positive, a definitive indication of normal recharging of the battery, by the charging system or mechanism (generator or alternator) of the combustion engine. In contrast, for battery voltage (BV) equal to or less than the value (RV3) of third reference voltage 146, evaluation of (BV–RV3) becomes zero or negative, respectively, a definitive indication of low, or less than normal, recharging of the battery, by the charging system or mechanism (generator or alternator) of the combustion engine.

During normal recharging of the battery by the charging system or mechanism of the combustion engine, the battery voltage (BV) is less than the voltage generated and supplied to the battery by the charging system or mechanism. During low, or less than normal, recharging of the battery by the charging system or mechanism of the combustion engine, the battery voltage (BV) is larger than the voltage generated and supplied to the battery by the charging system or mechanism. Ordinarily, in the electrical system and circuitry of a combustion engine, the charging system or mechanism of the combustion engine is operatively connected in parallel to the battery leads 30 and 32 of the combustion engine battery. Accordingly, the higher value between (i) the voltage generated and supplied to the battery by the charging system or mechanism, and (ii) the battery voltage (BV), is sent to, and sensed by, third integrator 148.

In sub-step (vi) of Step (c), of each of the first and second preferred embodiments 100 (FIG. 3) and 200 (FIG. 4), respectively, there is integrating the evaluated differences between the battery voltage (BV) and the value (RV3) of third reference voltage 146 by third integrator 148, via third multi-functional module 104, during each engine starting.

Third integrator 148 continuously or discontinuously integrates a stream or plurality of analog or digital values of (BV–RV3) varying in time. During the engine starting, the plurality of values of (BV–RV3) generated according to normal, or, low or less than normal, recharging of the battery by the charging system or mechanism of the combustion engine, is either positive, or, zero or negative, respectively. Accordingly, the output signal of third integrator 148 is a positive, or, zero or negative, respectively, analog or digital value.

In sub-step (vii) of Step (c), of each of the first and second preferred embodiments 100 (FIG. 3) and 200 (FIG. 4), respectively, there is determining and responding to the output signal of third integrator 148 by fourth detector 150, via third multi-functional module 104, during each engine starting.

The output signal of third integrator 148 is continuously or discontinuously sent, via junction 196, to fourth detector 150. Fourth detector 150 determines if the value of the integrator output signal is equal to or greater than, or, less than, a pre-determined value of fourth detector 150, hereinafter, also referred to as PDV-D4. Pre-determined value (PDV-D4) of fourth detector 150, is preferably, but not limited to being, set at a positive value, representing a normal increase in battery voltage during engine starting, corresponding to normal recharging of the battery by the charging system or mechanism of the combustion engine. According to the result of this decision making step, the responsive output signal of fourth detector 150 is a digital, preferably, logic value, '1' or '0', respectively.

In sub-step (viii) of Step (c), of each of the first and second preferred embodiments 100 (FIG. 3) and 200 (FIG. 4), respectively, there is determining and responding to a change in the output signal of fourth detector 150 by second one shot 152, via third multi-functional module 104, during each engine starting.

Second one shot 152, being a 'mono-stable' electronic component or software routine, normally provides a single or mono-stable digital output signal, preferably, a logic value, '0' or '1'. The output signal of fourth detector 150 is continuously or discontinuously sent, via junction 198, to second one shot 152. During engine starting, second one shot 152 determines if there is a change in the output signal of fourth detector 150, for example, from '0' to '1', and responds accordingly by changing the output signal of second one shot 152, for example, from '0' to '1', respectively, for an 'unstable', or pre-determined, time interval, hereinafter referred to as T[second one shot].

For a normal increase in battery voltage during engine starting, corresponding to normal recharging of the battery by the charging system or mechanism of the combustion engine, the output signal of fourth detector 150 changes from '0' to '1', whereby second one shot 152 determines this change, and responds accordingly by changing the output signal of second one shot 152 from '0' to '1', for the duration of the pre-determined time interval, T[second one shot], even if during T[second one shot] the output signal of fourth detector 150 changes back from '1' to '0'.

For a low or less than normal increase in battery voltage during engine starting, corresponding to low or less than normal recharging of the battery by the charging system or mechanism of the combustion engine, the output signal of fourth detector 150 is '0', whereby second one shot 152 responds by remaining in its mono-stable state with an output signal of '0'.

In sub-step (ix) of Step (c), of each of the first and second preferred embodiments 100 (FIG. 3) and 200 (FIG. 4), respectively, there is determining and responding to the output signal of second one shot 152 by flip-flop 154, via third multi-functional module 104, during each engine starting.

The output signal of second one shot 152 is continuously or discontinuously sent, via junction 200, to flip-flop 154. For a normal increase in battery voltage during engine starting, corresponding to normal recharging of the battery by the charging system or mechanism of the combustion engine, the output signal of second one shot 152 is '1', for the duration of the pre-determined time interval, T[second one shot]. For a low or less than normal increase in battery voltage during engine starting, corresponding to low or less than normal recharging of the battery by the charging system or mechanism of the combustion engine, the output signal of second one shot 152 is '0'.

Flip-flop 154 determines and responds to the output signal of second one shot 152 by registering and storing indication of normal, or, low or less than normal, recharging of the battery by the charging system or mechanism of the combustion engine, according to one of the corresponding logic values, '0' or '1', respectively. The first logic value of '0' corresponds to normal recharging of the battery during engine operation, and the second logic value of '1' corresponds to low or less than normal battery recharging during engine operation.

Flip-flop 154 stores the indication of normal, or, low or less than normal, recharging of the battery during engine operation, until this indication is reset by operation of a reset step or mechanism, for example, by second reset delay 144, as previously described above in sub-step (iii) of Step (c), for each engine starting. Therein, following a delay, the output signal of third detector 142 is sent to flip-flop 154, via junction 192, and causes resetting of flip-flop 154, for each engine starting.

In Step (d), of each of the first and second preferred embodiments 100 (FIG. 3) and 200 (FIG. 4), respectively, there is in-use unambiguously determining a single logically correct specific case, from a plurality of different logically correct specific cases, associated with the combustion engine battery in, or not in, the near-end-of-life (NEOL) state, by logic function linking group 112 performing logic operations and making decisions using simultaneously received output values of first multi-functional module (10' in first preferred embodiment 100; 15' in second preferred embodiment 200), second multi-functional module 102, and third multi-functional module 104, during each engine starting.

In sub-step (i) of Step (d), of each of the first and second preferred embodiments 100 (FIG. 3) and 200 (FIG. 4), respectively, there is substantially simultaneously receiving: (1) the output signal of first counter 74 sent via first multi-functional module output 116; (2) the output signal of second counter 140 sent via second multi-functional module output 118; and, (3) the output signal of first 'AND' logic element 156 sent via third multi-functional module output 120, by logic function linking group 112, during each engine starting.

As described in previous sub-step (x) of Step (a), the output signal of first counter 74 is continuously or discontinuously sent, via first multi-functional module output 116, to logic function linking group 112, for input into the various logic operations and decisions performed by logic function linking group 112.

In scenario (1), where the battery exhibits normal cranking strength during engine starting, first counter reset mechanism 75 associated with first counter 74 is activated for resetting first counter 74. Then, first counter 74 sends an output signal of '0' to logic function linking group 112.

In scenario (2), where the battery exhibits low, or less than normal, cranking strength during engine starting, first counter reset mechanism 75 associated with first counter 74 remains inactive, and responds by not resetting the new count number of, for example, 5, to zero. Then, first counter 74 sends an output signal of '1' to logic function linking group 112.

As described in previous sub-step (v) of Step (b), the output signal of second counter 140 is continuously or discontinuously sent, via second multi-functional module output 118, to logic function linking group 112, for input into the various logic operations and decisions performed by logic function linking group 112.

In scenario (1), where the battery exhibits normal cranking strength during engine starting, second detector 138 determines the value of the output signal of second integrator 136 to be less than the pre-determined value (PDV-D2) of second detector 138, such the output signal of second detector 138 is '0'. Second counter 140 responds by not incrementing its current count number (CN2) of occurrences of low cranking strength of the battery, and continues to register a count number (CN2) of occurrences of low, or less than normal, cranking strength of the battery less than PDCN-C2.

In scenario (2), where the battery exhibits low, or less than normal, cranking strength during engine starting, second detector 138 determines the value of the output signal of second integrator 136 to be equal to or greater than the pre-determined value (PDV-D2) of second detector 138, such that the output signal of second detector 138 changes from '0' to '1'. Second counter 140 responds by incrementing its count number (CN2) of occurrences of low cranking strength of the battery, and sends an output signal, via second multi-functional module output 118, to logic function linking group 112, according to one of the following previously stated two specific conditions or logic operations:

(A) If second counter 140 registers a count number (CN2) less than PDCN-C2, second counter 140 sends an output signal of '1', (indicated as 'No' in FIGS. 3 and 4) via second multi-functional module output 118-N, via junction 178, to logic function linking group 112.

(B) If second counter 140 registers a count number (CN2) equal to or greater than PDCN-C2, second counter 140 sends an output signal of '1', (indicated as 'Yes' in FIGS. 3 and 4), via second multi-functional module output 118-Y, via junction 180, to logic function linking group 112.

As described in previous sub-step (ii) of Step (c), during engine starting, the result of the 'AND' logic operation is either '1' 'AND' '0', or, '1' 'AND' '1', according to the value of the output signal of third detector 142, always equal to '1', and the value of the output signal of flip-flop 154, equal to '0' or '1', respectively. As described in previous sub-step (ix) of Step (c), flip-flop 154 registers and stores indication of normal, or, low or less than normal, recharging of the battery by the charging system or mechanism of the combustion engine, according to one of the corresponding logic values, '0' or '1', respectively. According to the result of this decision making step, the responsive output signal of 'AND' logic element 156 is a digital, preferably, logic value, '0' or '1', which is sent, via third multi-functional module output 120, via signal path 190, to logic function linking group 112, for input into the various logic operations and decisions performed by logic function linking group 112.

Logic function linking group 112 analyzes and responds to the substantially simultaneous reception of (1) the output signal of first counter 74, (2) the output signal of second counter 140, and, (3) the output signal of first 'AND' logic element 156, by performing the following logic operations and decisions, during each engine starting.

In sub-step (ii) of Step (d), of each of the first and second preferred embodiments 100 (FIG. 3) and 200 (FIG. 4), respectively, there is unambiguously determining the single logically correct specific case, from the plurality of different logically correct specific cases, associated with the combustion engine battery in, or not in, the near-end-of-life (NEOL) state, by logic function linking group 112 performing logic operations and making decisions using the substantially simultaneously received: (1) output signal of first counter 74, (2) output signal of second counter 140, and, (3) output signal of first 'AND' logic element 156, during each engine starting.

As previously described above, in each of the first and second preferred embodiments 100 (FIG. 3) and 200 (FIG. 4), respectively, logic function linking group 112 features the following operatively connected logic elements (indicated by the plurality of 'AND', 'OR', and 'NOT' conventionally known and used terms and symbols shown 'outside' of the dashed dark line enclosed multi-functional modules): (i) second 'AND' logic element 158, (ii) third 'AND' logic element 160, (iii) fourth 'AND' logic element 162, (iv) fifth 'AND' logic element 164, (v) 'OR' logic element 166, (vi) first 'NOT' logic element 168, and (vii) second 'NOT' logic element 170.

There is a plurality of four different logically correct specific cases associated with the combustion engine battery in, or not in, the near-end-of-life (NEOL) state, according to four different combinations of output values of the operatively connected logic elements of logic function linking group 112 and the different values of the substantially simultaneously received: (1) output signal of first counter 74, (2) output signal of second counter 140, and (3) output signal of first 'AND' logic element 156, during each engine starting.

Three of the four different logically correct specific cases associated with the combustion engine battery in, or not in, the near-end-of-life (NEOL) state, specifically relate to the combustion engine battery not in the near-end-of-life (NEOL) state, according to three corresponding different combinations of output values of the operatively connected logic elements of logic function linking group 112 and the different values of the substantially simultaneously received: (1) output signal of first counter 74, (2) output signal of second counter 140, and (3) output signal of first 'AND' logic element 156, during each engine starting.

Accordingly, one of the four different logically correct specific cases associated with the combustion engine battery in, or not in, the near-end-of-life (NEOL) state, specifically and uniquely relates to the combustion engine battery in the near-end-of-life (NEOL) state according to one unique combination of output values of the operatively connected logic elements of logic function linking group 112 and the different values of the substantially simultaneously received: (1) output signal of first counter 74, (2) output signal of second counter 140, and (3) output signal of first 'AND' logic element 156, during each engine starting.

The three different logically correct specific cases associated with the combustion engine battery not in the near-end-of-life (NEOL) state are unambiguously determined as follows:

Specific Case (1): low, or less than normal, recharging of the battery by the charging system or mechanism of the combustion engine, according to the output signal of 'AND' logic element 156 having the logic value, '1', sent via third multi-functional module output 120, via signal path 190, to logic function linking group 112.

Specific Case (2): the battery exhibiting low, or less than normal, cranking strength during engine starting, according to (A) the output signal of second counter 140 corresponding to a count number (CN2) less than PDCN-C2, whereby second counter 140 sends an output signal of '1', (indicated as 'No' in FIGS. 3 and 4) via second multi-functional module output 118-N, via junction 178, to logic function linking group 112, OR, according to (B) the output signal of second counter 140 corresponding to a count number (CN2) equal to or greater than PDCN-C2, whereby second counter 140 sends an output signal of '1', (indicated as 'Yes' in FIGS. 3 and 4), via second multi-functional module output 118-Y, via junction 180, to logic function linking group 112.

Specific Case (3): the battery exhibiting low, or less than normal, cranking strength during engine starting, according to (A) of Specific Case (2), whereby the output signal of second counter 140 corresponds to a count number (CN2) less than PDCN-C2, whereby second counter 140 sends an output signal of '1', (indicated as 'No' in FIGS. 3 and 4) via second multi-functional module output 118-N, via junction 178, to logic function linking group 112, AND, according to scenario (2) of the battery exhibiting low, or less than normal, cranking strength during engine starting, whereby first counter reset mechanism 75 associated with first counter 74 remains inactive, and first counter 74 sends an output signal of '1', via first multi-functional module output 116, to logic function linking group 112.

Specific Case (3) is indicative that the value of the slope of the hereinabove previously introduced and defined implicit electrical parameter, P(engine starting history), ($\Delta V$)/(N), corresponding to battery voltage differences ($\Delta V$) as a function of the number of engine startings (N) is unusually high, corresponding to an unusually high or abnormal decrease in the change in battery voltage as a function of the number of engine startings. Specific Case (3) is indicative of the possibility of a malfunctioning charging system or mechanism of the combustion engine, which may be abnormally recharging the battery during normal steady state operation and usage of the combustion engine. Alternatively, Specific Case (3) is indicative of the possibility of a fault in the circuit, wiring, or activation, of an anti-theft alarm device, involving a relatively small, but continuous, parasitic load being placed upon the battery during engine non-operating conditions, thereby gradually accelerating loss of battery cranking strength, resulting in development or exhibition of low cranking strength as a result of a bad state of charge (SOC). Accordingly, in such scenarios of Specific Case (3), the combustion engine battery, having a bad state of charge (SOC), usually still has a good state of health (SOH) and simply requires a recharge, followed by checking the combustion engine for identifying and repairing the specific malfunction or fault in the operation of the overall electrical system of the combustion engine.

The one logically correct specific case associated with the combustion engine battery in the near-end-of-life (NEOL) state is unambiguously determined as follows:

Specific Case (4)—(NEOL) state: normal recharging of the battery by the charging system or mechanism of the combustion engine, according to the output signal of 'AND' logic element 156 having the logic value, '0', sent via third multi-functional module output 120, via signal path 190, to logic function linking group 112, AND, the battery exhibiting low, or less than normal, cranking strength during engine starting, according to (B) of Specific Case (2), whereby the output signal of second counter 140 corresponds to a count number (CN2) equal to or greater than PDCN-C2, whereby second counter 140 sends an output signal of '1', (indicated as 'Yes' in FIGS. 3 and 4), via second multi-functional module output 118-Y, via junction 180, to logic function linking group 112, AND, according to scenario (2) of the battery exhibiting low, or less than normal, cranking strength during engine starting, whereby first counter reset mechanism 75 associated with first counter 74 remains inactive, and first counter 74 sends an output signal of '1', via first multi-functional module output 116, to logic function linking group 112.

For Specific Case (4), the combustion engine battery, determined as being in the near-end-of-life (NEOL) state, and therefore having a bad state of health (SOH), is essentially unrechargeable and should be replaced by a new battery prior to the battery reaching the end of its life or becoming dead.

In Step (e), of each of the first and second preferred embodiments 100 (FIG. 3) and 200 (FIG. 4), respectively, there is indicating the unambiguously determined single logically correct specific case, from the plurality of different logically correct specific cases, associated with the combustion engine battery in, or not in, the near-end-of-life (NEOL) state, by indicating mechanism 114 operatively connected to logic function linking group 112.

As previously described above, in each of the first and second preferred embodiments 100 (FIG. 3) and 200 (FIG.

4), respectively, indicating mechanism 114 includes (i) first indicator 114a, (ii) second indicator 114b, and (iii) third indicator 114c, which are operatively connected, via input/output signal paths and junctions, to appropriate logic elements of logic function linking group 112. The type of indicating performed by indicating mechanism 114, in general, and performed by first indicator 114a, second indicator 114b, and third indicator 114c, in particular, is selected from the group consisting of an audible type of indicating, a visual type of indicating, and a combination thereof.

Indicating of each logically correct specific case (1)–(4), unambiguously determined in immediately preceding Step (d), is performed as follows:

In the event Specific Case (1) is the determined single logically correct specific case, there is activating indicator 114b of indicating mechanism 114.

In the event Specific Case (2) is the determined single logically correct specific case, there is activating indicator 114b of indicating mechanism 114.

In the event Specific Case (3) is the determined single logically correct specific case, there is activating indicator 114c of indicating mechanism 114.

In the event Specific Case (4), corresponding to the near-end-of-life (NEOL) state, is the determined single logically correct specific case, there is activating indicator 114a of indicating mechanism 114.

It is to be fully understood that implementation of the method and device of the present invention, as illustratively described above, is not limited by operative inclusion of only one additional, or only one second, level of monitoring the starting history of the combustion engine, in general, and of the combustion engine battery, in particular, in terms of changes in battery voltages during engine starting as a function of the number of engine startings. More specifically, in alternative embodiments of each of the first and second preferred embodiments 100 (FIG. 3) and 200 (FIG. 4), respectively, of the method and device of the present invention, there is substantially simultaneously performing and completing sub-steps (i)–(v) of Step (b) a plurality of at least two times, instead of just one time, via operation of a corresponding plurality of second multi-functional modules 102, substantially simultaneous to performing sub-steps (i)–(x) of Step (a) via operation of first multi-functional module (10' in first preferred embodiment 100; 15' in second preferred embodiment 200).

In such alternative embodiments, the value (RV2', RV2", etc.) of each 'successively additional' (that is, second, third, etc., respectively) second reference voltage 134, used during operation of each corresponding successively additional (that is, second, third, etc., respectively) second multi-functional module 102, is different, preferably larger, than the value (RV2, RV2', etc., respectively) of the immediately preceding (that is, first, second, etc., respectively) second reference voltage 134, used during operation of each corresponding immediately preceding (that is, first, second, etc., respectively) second multi-functional module 102.

Moreover, in such alternative embodiments, there is appropriately assigning pre-determined values (PDV-D2', PDV-D2", etc., respectively) to successively additional (that is, second, third, etc., respectively) second detectors 138, and appropriately assigning pre-determined count numbers (PDCN-C2', PDCN-C2", etc., respectively) to successively additional (that is, second, third, etc., respectively) second counters 140, used during operation of each corresponding successively additional (that is, second, third, etc., respectively) second multi-functional module 102.

Furthermore, in such alternative embodiments, the first criterion of two criteria in the first set of low cranking strength criteria again corresponds to the first integrator output signal being equal to or greater than the pre-determined value (PDV-D1) of first detector 18, and the second criterion in the first set of low cranking strength criteria again corresponds to first counter 74 registering a count number equal to or greater than the pre-determined count number (PDCN-C1) of first counter 74.

However, the first criterion of two criteria in each successively additional (that is, second, third, etc.) second set of low cranking strength criteria corresponds to a successively additional (that is, second, third, etc., respectively) second integrator output signal being equal to or greater than a successively additional (that is, second, third, etc., respectively) pre-determined value (PDV-D2', PDV-D2", etc., respectively) of a successively additional (that is, second, third, etc., respectively) second detector 138. The second criterion in each successively additional (that is, second, third, etc.) second set of low cranking strength criteria corresponds to a successively additional (that is, second, third, etc., respectively) second counter 140 registering a count number equal to or greater than a successively additional (that is, second, third, etc., respectively) predetermined count number (PDCN-C2', PDCN-C2", etc., respectively) of a successively additional (that is, second, third, etc., respectively) second counter 140.

Thus, it is understood from the embodiments of the invention herein described and illustrated, above, that the method and system for in-use unambiguously determining and indicating the near-end-of-life (NEOL) state of a combustion engine battery, by way of in-use unambiguously distinguishing, and indicating, among different causes of the development or exhibition of low cranking strength of a combustion engine battery, with respect to the distinct differences between a bad state of health (SOH) and a bad state of charge (SOC) of the combustion engine battery, of the present invention, are neither anticipated or obviously derived from the prior art.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described in conjunction with specific embodiments and examples thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for in-use unambiguously determining the near-end-of-life state of a combustion engine battery, the combustion engine battery providing electrical power for cranking a crankshaft for starting the combustion engine and is automatically recharged by a charging system of the combustion engine following engine starting, the method comprising the steps of:

(a) counting a first number of occurrences of low cranking strength exhibited by the battery, for a plurality of engine startings, via operative connection of a first multi-functional module, operating with a first set of low cranking strength criteria, to a logic function linking group, said first set of low cranking strength criteria is based on using value of a first reference voltage;

(b) substantially simultaneous to step (a), counting a second number of said occurrences of low cranking strength exhibited by the battery, for same said plurality of engine startings of step (a), via operative connection of a second multi-functional module, operating with a second set of low cranking strength criteria, to said logic function linking group, said second multi-functional module is operatively connected in parallel to said first multi-functional module, said second set of low cranking strength criteria is based on using value of a second reference voltage, whereby said value of said second reference voltage is different from said value of said first reference voltage;

(c) monitoring extent to which the battery was recharged, in terms of voltage supplied, by the charging system of the combustion engine during previous operation of the combustion engine, via additional operative parallel connection of a third multi-functional module to said logic function linking group operative with said first and said second multi-functional modules, during each said engine starting; and (d) unambiguously determining a single logically correct specific case, from a plurality of different logically correct specific cases, associated with the combustion engine battery in, or not in, the near-end-of-life state, by said logic function linking group performing logic operations and making decisions using simultaneously received output values of said first, said second, and said third, multi-functional modules, during each said engine starting.

2. The method of claim 1, whereby step (a) includes integrating logic values generated by a comparator which compares and assigns logic values to changes in voltage of the battery relative to said value of said first reference voltage, for forming an output signal of a first integrator which is sent to a first detector, during each said engine starting.

3. The method of claim 1, whereby step (a) includes integrating analog values of changes in voltage of the battery relative to said value of said first reference voltage, for forming an output signal of a first integrator which is sent to a first detector, during each said engine starting.

4. The method of claim 1, whereby said value of said first reference voltage and said value of said second reference voltage each corresponds to less than normal but sufficient cranking strength of the battery required for activation and initiation of the cranking of the combustion engine crankshaft from initiation of and during each said engine starting.

5. The method of claim 1, whereby said value of said second reference voltage is larger than said value of said first reference voltage.

6. The method of claim 1, whereby said value of said first reference voltage and said value of said second reference voltage each corresponds to less than normal but sufficient cranking strength of the battery required for activation and initiation of the cranking of the combustion engine crankshaft from initiation of and during each said engine starting, and whereby said value of said second reference voltage is larger than said value of said first reference voltage.

7. The method of claim 1, whereby step (a) includes integrating values corresponding to changes in voltage of the battery relative to said value of said first reference voltage, for forming an output signal of a first integrator which is sent to a first detector, during each said engine starting, whereby said first integrator output signal being equal to or greater than a pre-determined value of said first detector corresponds to first criterion of two criteria in said first set of low cranking strength criteria.

8. The method of claim 7, whereby step (a) includes operation of a first counter, whereby said first counter registering said first count number of said occurrences of low cranking strength exhibited by the battery equal to or greater than a pre-determined count number of said first counter corresponds to second criterion of said two criteria in said first set of low cranking strength criteria.

9. The method of claim 7, whereby step (b) includes integrating values corresponding to changes in voltage of the battery relative to said value of said second reference voltage, for forming an output signal of a second integrator which is sent to a second detector, during each said engine starting, whereby said second integrator output signal being equal to or greater than a pre-determined value of said second detector corresponds to first criterion of two criteria in said second set of low cranking strength criteria.

10. The method of claim 8, whereby step (b) includes operation of a second counter, whereby said second counter registering said second count number of said occurrences of low cranking strength exhibited by the battery equal to or greater than a pre-determined count number of said second counter corresponds to second criterion of said two criteria in said second set of low cranking strength criteria.

11. The method of claim 1, whereby step (c) includes detecting each occurrence of each said engine starting.

12. The method of claim 9, whereby step (c) includes integrating values corresponding to changes in voltage of the battery relative to value of a third reference voltage, for forming an output signal of a third integrator which is sent to a third detector, during each said engine starting, for determining a value of said third integrator output signal selected from the group consisting of equal to or greater than, and, less than, a pre-determined value of said third detector, said pre-determined value of said third detector representing a normal increase in said voltage of the battery during said engine starting and corresponding to normal recharging of the battery by the charging system of the combustion engine.

13. The method of claim 1, whereby in step (d) there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting.

14. The method of claim 1, whereby in step (d) there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting, whereby three of said four different logically correct specific cases specifically relate to the combustion engine battery not in the near-end-of-life state.

15. The method of claim 1, whereby in step (d) there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting, whereby one of said four different logically correct specific cases specifically and uniquely relates to the combustion engine battery in the near-end-of-life state.

16. The method of claim 1, whereby in step (d) one of said plurality of different logically correct specific cases specifically and uniquely relates to the combustion engine battery in the near-end-of-life state, according to one unique combination of output values of operatively connected logic elements of said logic function linking group and different values of said simultaneously received output values of said first, said second, and said third, multi-functional modules, during each said engine starting, corresponding to normal recharging of the battery by the charging system of the combustion engine, and corresponding to the battery exhibiting low, or less than normal, cranking strength during engine starting.

17. The method of claim 1, further including step (e) of indicating said unambiguously determined single logically correct specific case, from said plurality of said different logically correct specific cases, associated with the combustion engine battery in, or not in, the near-end-of-life state, by an indicating mechanism operatively connected to said logic function linking group.

18. The method of claim 17, whereby type of said indicating performed by said indicating mechanism is selected from the group consisting of an audible type of indicating, a visual type of indicating, and a combination thereof.

19. A device for in-use unambiguously determining the near-end-of-life state of a combustion engine battery, the combustion engine battery providing electrical power for cranking a crankshaft for starting the combustion engine and is automatically recharged by a charging system of the combustion engine following engine starting, comprising:

(a) a first multi-functional module, operating with a first set of low cranking strength criteria, operatively connected to a logic function linking group, for counting a first number of occurrences of low cranking strength exhibited by the battery, for a plurality of engine startings, said first set of low cranking strength criteria is based on using value of a first reference voltage;

(b) a second multi-functional module, operating with a second set of low cranking strength criteria, operatively connected to said logic function linking group and operatively connected in parallel to said first multi-functional module, for counting a second number of said occurrences of low cranking strength exhibited by the battery, substantially simultaneous to step (a), for same said plurality of engine startings of step (a), said second set of low cranking strength criteria is based on using value of a second reference voltage, whereby said value of said second reference voltage is different from said value of said first reference voltage;

(c) a third multi-functional module, additionally operatively parallel connected to said logic function linking group operative with said first and said second multi-functional modules, for monitoring extent to which the battery was recharged, in terms of voltage supplied, by the charging system of the combustion engine during previous operation of the combustion engine, during each said engine starting; and (d) said logic function linking group, for performing logic operations and making decisions using simultaneously received output values of said first, said second, and said third, multi-functional modules, for unambiguously determining a single logically correct specific case, from a plurality of different logically correct specific cases, associated with the combustion engine battery in, or not in, the near-end-of-life state, during each said engine starting.

20. The device of claim 19, whereby said first multi-functional module includes a first integrator for integrating logic values generated by a comparator which compares and assigns logic values to changes in voltage of the battery relative to said value of said first reference voltage, for forming an output signal of said first integrator which is sent to a first detector, during each said engine starting.

21. The device of claim 19, whereby said first multi-functional module includes a first integrator for integrating analog values of changes in voltage of the battery relative to said value of said first reference voltage, for forming an output signal of a first integrator which is sent to a first detector, during each said engine starting.

22. The device of claim 19, whereby said value of said first reference voltage and said value of said second reference voltage each corresponds to less than normal but sufficient cranking strength of the battery required for activation and initiation of the cranking of the combustion engine crankshaft from initiation of and during each said engine starting.

23. The device of claim 19, whereby said value of said second reference voltage is larger than said value of said first reference voltage.

24. The device of claim 19, whereby said value of said first reference voltage and said value of said second reference voltage each corresponds to less than normal but sufficient cranking strength of the battery required for activation and initiation of the cranking of the combustion engine crankshaft from initiation of and during each said engine starting, and whereby said value of said second reference voltage is larger than said value of said first reference voltage.

25. The device of claim 19, whereby said first multi-functional module includes a first integrator for integrating values corresponding to changes in voltage of the battery relative to said value of said first reference voltage, for forming an output signal of said first integrator which is sent to a first detector, during each said engine starting, whereby said first integrator output signal being equal to or greater than a pre-determined value of said first detector corresponds to first criterion of two criteria in said first set of low cranking strength criteria.

26. The device of claim 25, whereby said first multi-functional module includes operation of a first counter, whereby said first counter registering said first count number of said occurrences of low cranking strength exhibited by the battery equal to or greater than a pre-determined count number of said first counter corresponds to second criterion of said two criteria in said first set of low cranking strength criteria.

27. The device of claim 25, whereby said second multi-functional module includes a second integrator for integrating values corresponding to changes in voltage of the battery relative to said value of said second reference voltage, for forming an output signal of said second integrator which is sent to a second detector, during each said engine starting, whereby said second integrator output signal being equal to or greater than a pre-determined value of said second detector corresponds to first criterion of two criteria in said second set of low cranking strength criteria.

28. The device of claim 26, whereby said second multi-functional module includes operation of a second counter, whereby said second counter registering said second count number of said occurrences of low cranking strength exhibited by the battery equal to or greater than a pre-determined count number of said second counter corresponds to second criterion of said two criteria in said second set of low cranking strength criteria.

29. The device of claim 19, whereby said third multi-functional module detects each occurrence of each said engine starting.

30. The device of claim 27, whereby said third multi-functional module includes a third integrator for integrating values corresponding to changes in voltage of the battery relative to value of a third reference voltage, for forming an output signal of said third integrator which is sent to a third detector, during each said engine starting, for determining a value of said third integrator output signal selected from the group consisting of equal to or greater than, and, less than, a pre-determined value of said third detector, said pre-determined value of said third detector representing a normal increase in said voltage of the battery during said engine starting and corresponding to normal recharging of the battery by the charging system of the combustion engine.

31. The device of claim 19, whereby there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting.

32. The device of claim 19, whereby there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting, whereby three of said four different logically correct specific cases specifically relate to the combustion engine battery not in the near-end-of-life state.

33. The device of claim 19, whereby there is a plurality of four said different logically correct specific cases associated with the combustion engine battery in, or not in, the near-end-of-life state, according to four different combinations of output values of operatively connected logic elements of said logic function linking group and different values of said simultaneously received output values of said first, said second, and said third, multi-functional modules, during each said engine starting, whereby one of said four different logically correct specific cases specifically and uniquely relates to the combustion engine battery in the near-end-of-life state.

34. The device of claim 19, whereby one of said plurality of different logically correct specific cases specifically and uniquely relates to the combustion engine battery in the near-end-of-life state, according to one unique combination of output values of operatively connected logic elements of said logic function linking group and different values of said simultaneously received output values of said first, said second, and said third, multi-functional modules, during each said engine starting, corresponding to normal recharging of the battery by the charging system of the combustion engine, and corresponding to the battery exhibiting low, or less than normal, cranking strength during engine starting.

35. The device of claim 19, further including (e) an indicating mechanism operatively connected to said logic function linking group for indicating said unambiguously determined single logically correct specific case, from said plurality of said different logically correct specific cases, associated with the combustion engine battery in, or not in, the near-end-of-life state.

36. The device of claim 35, whereby type of said indicating performed by said indicating mechanism is selected from the group consisting of an audible type of indicating, a visual type of indicating, and a combination thereof.

* * * * *